US012635121B2

(12) United States Patent　　(10) Patent No.: US 12,635,121 B2
Chiang et al.　　(45) Date of Patent:　May 19, 2026

(54) MEMORY DEVICE, AND METHOD FOR FORMING THEREOF

(71) Applicant: Taiwan Semiconductor Manufacturing Company, Ltd., Hsinchu (TW)

(72) Inventors: Hung-Li Chiang, Taipei (TW); Jer-Fu Wang, Taipei (TW); Yi-Tse Hung, Hsinchu (TW); Chao-Ching Cheng, Hsinchu (TW); Iuliana Radu, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 592 days.

(21) Appl. No.: 18/162,717

(22) Filed: Feb. 1, 2023

(65) Prior Publication Data

US 2024/0130100 A1　　Apr. 18, 2024

Related U.S. Application Data

(60) Provisional application No. 63/415,976, filed on Oct. 13, 2022.

(51) Int. Cl.
H10B 10/00　　(2023.01)
(52) U.S. Cl.
CPC ................................. H10B 10/125 (2023.02)
(58) Field of Classification Search
None
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2015/0302917 A1* | 10/2015 | Grover .................. G11C 11/416 365/51 |
| 2016/0155492 A1* | 6/2016 | Zhang .................... H10D 89/10 365/189.11 |
| 2018/0012650 A1* | 1/2018 | Liaw ...................... G11C 11/419 |
| 2025/0061940 A1* | 2/2025 | Kim ..................... G11C 11/4094 |

* cited by examiner

*Primary Examiner* — Khaja Ahmad
(74) *Attorney, Agent, or Firm* — JCIPRNET

(57) ABSTRACT

A memory device is provided. The memory device includes a write pass-gate transistor, a read pass-gate transistor, a write word line, and a read word line. The write pass-gate transistor is disposed in a first layer. The read pass-gate transistor is disposed in a second layer above the first layer. The write word line is disposed in a metallization layer above the first layer and electrically coupled to the write pass-gate transistor through a write path. The read word line is disposed in the metallization layer and electrically coupled to the read pass-gate transistor through a read path. The write path is different from the read path.

20 Claims, 13 Drawing Sheets

200C

S210 — Forming pull-down transistors and write pass-gate transistors in a first layer above the substrate S220 — Forming pull-up transistors and read pass-gate transistors in a second layer above the first layer S230 — Forming signal lines for a write word line, a read word line, and bit lines above the second layer

FEOL ←|→ BEOL

FIG. 5

MEMORY DEVICE, AND METHOD FOR FORMING THEREOF

CROSS-REFERENCE TO RELATED APPLICATION

This application claims the priority benefit of U.S. provisional application Ser. No. 63/415,976, filed on Oct. 13, 2022. The entirety of the above-mentioned patent application is hereby incorporated by reference herein and made a part of this specification.

BACKGROUND

A common type of integrated circuit memory is a static random access memory (SRAM) device. A typical SRAM memory device has an array of memory cells, or "bit-cells". In some examples, each memory cell uses eight transistors connected between an upper reference potential and a lower reference potential (typically ground) such that one of two storage nodes can be occupied by the information to be stored, with the complementary information stored at the other storage node. Each bit in the SRAM cell is stored on four of the transistors, which form two cross-coupled inverters. The other four transistors are connected to the word lines to control access to the memory cell during read and write operations by selectively connecting the memory cell to the bit lines.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 is a schematic block diagram of variations of a complementary filed effect transistor in accordance with some embodiments of the present disclosure.

DETAILED DESCRIPTION

Figure 1:
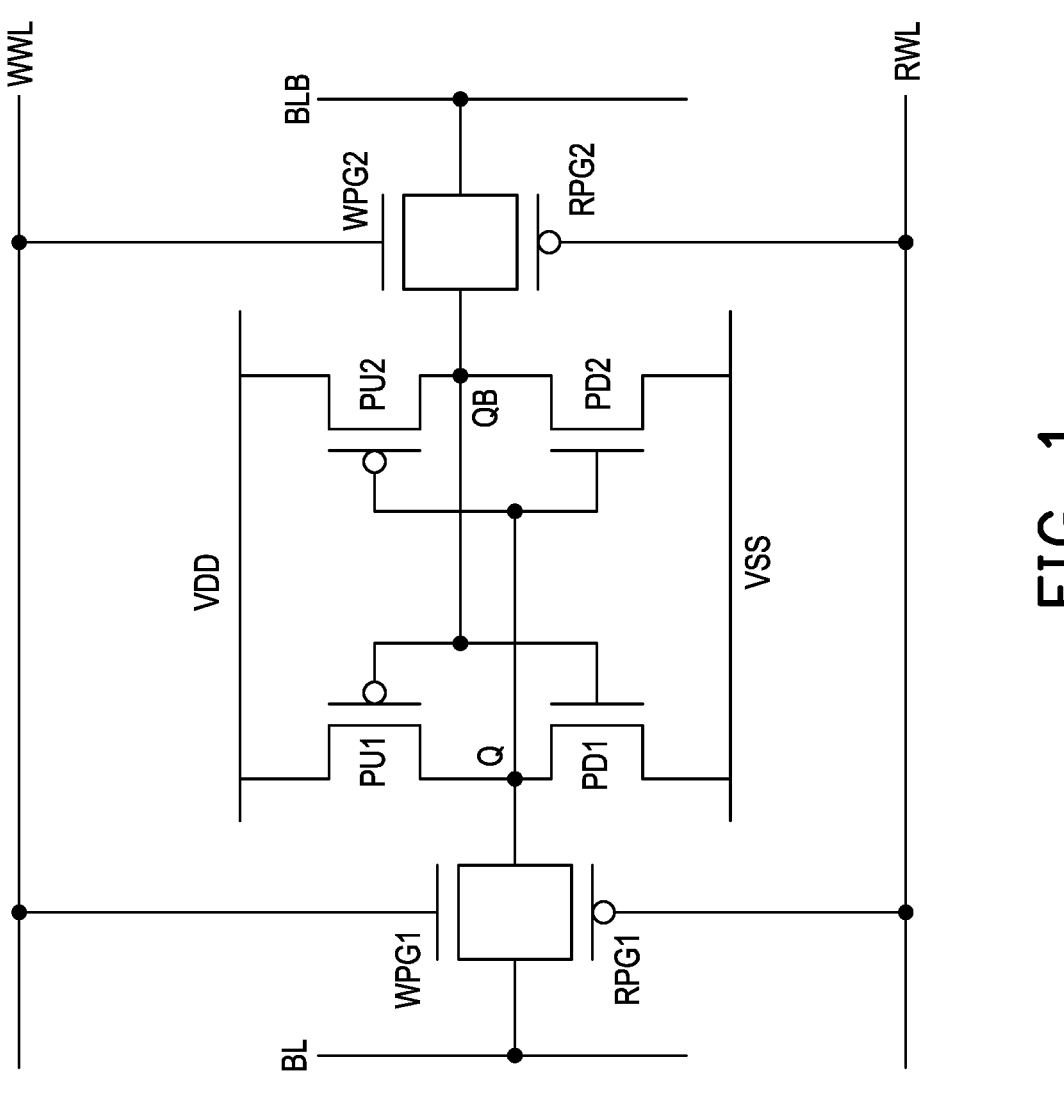
FIG. 1 is a schematic circuit diagram of a memory device in accordance with some embodiments of the present disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth" and the like, may be used herein for ease of description to describe similar or different element(s) or feature(s) as illustrated in the figures, and may be used interchangeably depending on the order of the presence or the contexts of the description.

An integrated circuit ("IC") includes one or more semiconductor devices. One way in which to represent a semiconductor device is with a plan view diagram referred to as a layout diagram. Layout diagrams are generated in a context of design rules. A set of design rules imposes constraints on the placement of corresponding patterns in a layout diagram, e.g., geographic/spatial restrictions, connectivity restrictions, or the like. Often, a set of design rules includes a subset of design rules pertaining to the spacing and other interactions between patterns in adjacent or abutting cells where the patterns represent conductors in a layer of metallization.

Typically, a set of design rules is specific to a process/technology node by which will be fabricated a semiconductor device based on a layout diagram. The design rule set compensates for variability of the corresponding process/ technology node. Such compensation increases the likelihood that an actual semiconductor device resulting from a layout diagram will be an acceptable counterpart to the virtual device on which the layout diagram is based.

A conventional SRAM is a planar device while the entire structure of the SRAM is formed parallel. On a restricted chip area, a large number of circuit elements are disposed and each piece of the chip area counts. A complementary field effect transistor (CFET) has been proposed to push conventional standard cell area scaling down, by utilizing a three-dimensional (3D) structure having nanowires/ nanosheets vertically stacked on top of each other. A CFET layout typically has P-type FETs (pFET) on one-level and N-type FETs (nFET) on an adjacent level (i.e., above or below). While integrating the CFET into a SRAM device, the layout design of the SRAM device is complicate and issues of routing congestion often happen. Hence, how to develop a simple and effective layout of a SRAM device utilizing a CFET is becoming an issue to work on.

FIG. 1 is a schematic circuit diagram of a memory device in accordance with some embodiments of the present disclosure. With reference to FIG. 1A, in some embodiments, the memory device 100 is a memory cell in a static random access memory (SRAM) array. The memory device 100 is arranged in rows and columns of the SRAM array. Each of the rows has a write word line WWL and a read word line RWL, and each of the columns has complementary bit lines BL, BLB corresponding thereto. The bit lines BL, BLB may be connected to an input output (I/O) block, which is configured to write and read data to and from the bit lines BL, BLB.

In one embodiment, the memory device 100 includes eight transistors and thus is an eight-transistor (8T) SRAM cell. The eight transistors of the memory device 100 may include pull-up transistors PU1, PU2, pull-down transistors PD1, PD2, write pass-gate transistors WPG1, WPG2, and read pass-gate transistors RPG1, RPG2. In one embodiment, the pull-down transistors PD1, PD2 and the write pass-gate transistors WG1, WPG2 may have a first conductive type (e.g., N-type), while the pull-up transistors PU1, PU2 and the read pass-transistor RPG1, RPG2 may have a second conductive type (e.g., P-type) complementary to the first conductive type (e.g., N-type). However, this disclosure does not limit the conductive type of the transistor. In some embodiments, the pull-up transistor PU2, the pull-down transistor, PD2, the write pass-gate transistor WPG2, and the read pass-gate transistor RPG2 may be also called an additional pull-up transistor PU2, an additional pull-down transistor PD2, an additional write pass-gate transistor WPG2, and an additional read pass-gate transistor RPG2.

In one embodiment, gate terminals of the write pass-gate transistors WPG1, WPG2 are coupled to a write word line WWL, such that the write pass-gate transistors WPG1, WPG2 can be controlled by the write word line WWL. Similarly, gate terminals of the read pass-gate transistors RPG1, RPG2 are coupled to a read word line RWL, such that the read pass-gate transistors RPG1, RPG2 can be controlled by the read word line RWL. Whether the memory device 100 is selected during a programming operation (write operation) or a read operation may be determined by whether the write pass-gate transistors WPG1, WPG2 or the read pass-gate transistors RPG1, RPG2 are switched on.

In one embodiment, source terminals of the pull-up transistors PU1, PU2 are coupled to a power supply voltage VDD, while source terminals of the pull-down transistors PD1, PD2 are coupled to a reference voltage VSS. Further, drain terminals of the pull-up transistor PU1 and the pull-down transistor PD1 as well as gate terminals of the pull-up transistor PU2 and the pull-down transistor PD2 may be coupled to the storage node Q. On the other hand, drain terminals of the pull-up transistor PU2 and the pull-down transistor PD2 as well as gate terminals of the pull-up transistor PU1 and the pull-down transistor PD1 may be coupled to the storage node QB. Accordingly, a first inverter formed of the pull-up transistor PU1 and the pull-down transistor PD1 is cross-coupled with a second inverter formed of the pull-up transistor PU2 and the pull-down transistor PD2. That is, the first inverter has an input coupled to an output of the second inverter, which may be the storage node QB. Likewise, the second inverter 104 has an input connected to an output of the first inverter, which may be the storage node Q. Further, A latch circuit formed of the two cross-coupled inverters is coupled between the power supply voltage VDD and the reference voltage VSS. By employing the two cross-coupled inverters, the memory device 100 can hold the data using the latch circuit, so that the stored data will not be lost without applying a refresh cycle, as long as the power supply voltage VDD remains coupled to the latch circuit.

The latch circuit formed of the pull-up transistors PU1, PU2 and the pull-down transistors PD1, PD2 is coupled between the write pass-gate transistors WPG1, WPG2 and the read pass-gate transistors RPG1, RPG2, and is functioned to store a data bit. Complementary values of the data bit are stored in storage nodes Q, QB of the latch circuit that are coupled to the write pass-gate transistors WPG1, WPG2 and the read pass-gate transistors RPG1, RPG2. The stored data bit can be written into, or read from the memory device 100 through the bit lines BL, BLB that carry complementary signals. Source and drain terminals of the write pass-gate transistor WPG1 and the read pass-gate transistor RPG1 may be coupled to the bit line BL and the storage node Q, whereas source and drain terminals of the write pass-gate transistor WPG2 and the read pass-gate transistor RPG2 may be coupled to the bit line BLB and the storage node QB.

In a write operation, an appropriate voltage is applied to the write word line WWL to turn on the write pass-gate transistors WPG1, WPG2. Data is written through at least one of the bit lines BL, BLB and is stored in the latch circuit formed by the cross-coupled inverters. During write operation, the read pass-gate transistors RPG1, RPG2 are turned OFF.

In a read operation, an appropriate voltage is applied to the read word line RWL to turn on the read pass-gate transistors RPG1, RPG2. Data is read from the latch circuit formed by the cross-coupled inverters through at least one of the bit lines BL, BLB.

It is noted that, at least one of the pull-up transistors PU1, PU2, the pull-down transistors PD1, PD2, the write pass-gate transistors WPG1, WPG2, and the read pass-gate transistors RPG1, RPG2 may be three dimensional transistors (e.g., CFET) instead of planar transistors, such that an area overhead of the memory device 100 can be significantly reduced while the density is increased.

Figure 2A:
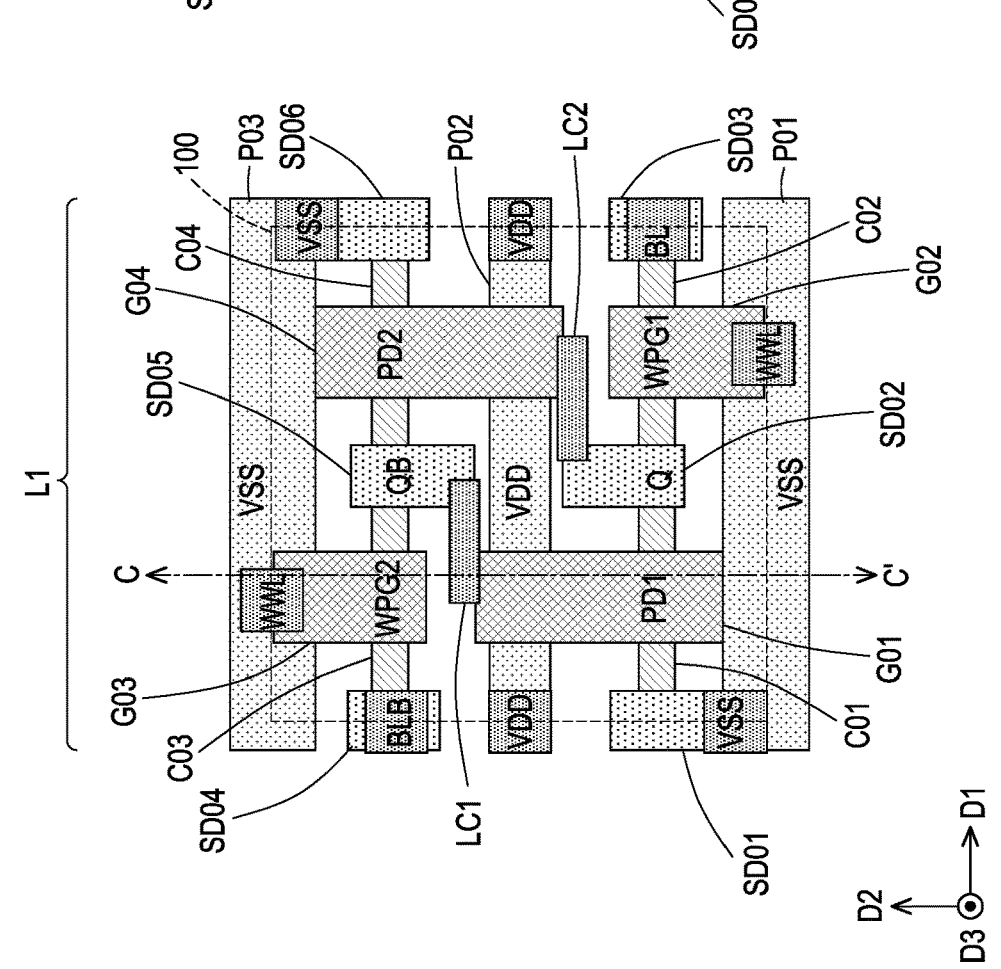
FIG. 2A is a schematic layout diagram of a memory device in accordance with some embodiments of the present disclosure.

FIG. 2A is a schematic layout diagram of a memory device in accordance with some embodiments of the present disclosure. With reference to FIG. 1 and FIG. 2A, a layout 200A of the memory device 100 includes a first layer L1 and a second layer L2. The write pass-gate transistors WPG1, WPG2 and the pull-down transistors PD1, PD2 may be formed within the first layer L1, whereas the read pass-gate transistors RPG1, RPG2 and the pull-up transistors PU1, PU2 may be formed within the second layer L2. As will be described, the second layer L2 may be disposed above and overlapped with the first layer L1, signal lines (e.g., write word line WWL, read word line RWL, bit line BL, bit line BLB) may be disposed above and overlapped with the second layer L2, and buried power rails P01, P02, P03 may be disposed below the first layer L1, such that a footprint area of the memory device 100 can be significantly reduced.

As shown in FIG. 2A, the pull-down transistor PD1 is defined by a gate structure G01, a pair of source/drain structures SD01, SD02 and a channel structure C01 within a first portion (e.g., lower portion) of the first layer L1. The gate structure G01 extends in between the pair of source/drain structures SD01, SD02, and the channel structure C01 laterally penetrates through the gate structure G01 and connects with the pair of source/drain structures SD01, SD02. As will be further described, the gate structure G01 of the pull-down transistor PD1 is connected with a gate structure G05 of the pull-up transistor PU1 in the second layer L2. In addition, the source/drain structure SD01 may be coupled to a buried power rail P01 held at the reference voltage VSS lying below the first layer L1 and configured to receive the reference voltage VSS as shown in FIG. 1.

On the other hand, the write pass-gate transistor WPG1 is defined by a gate structure G02, the source/drain structures SD02, an additional source/drain structure SD03, and a channel structure C02 within the first portion of the first layer L1. The gate structure G02 extends in between the pair of source/drain structures SD02, SD03, and the channel structure C02 laterally penetrates through the gate structure G02 and connects with the pair of source/drain structures SD02, SD03. As will be further described, the gate structure G02 is coupled to the write word line WWL (also shown in FIG. 1) lying above the second layer L2. In addition, the source/drain structure SD02 is shared by the pull-down transistor PD1 and the write pass-gate transistor WPG1, while the source/drain structure SD03 may be coupled to the bit line BL (also shown in FIG. 1) lying above the second layer L2. Further, the source/drain structure SD02 may be coupled to the storage node Q (also shown in FIG. 1).

Similarly, the pull-down transistor PD2 is defined by a gate structure G04, a pair of source/drain structures SD05, SD06 and a channel structure C04 within a second portion (e.g., upper portion) of the first layer L1. The gate structure G04 extends in between the pair of source/drain structures SD05, SD06, and the channel structure C04 laterally penetrates through the gate structure G04 and connects with the pair of source/drain structures SD05, SD06. As will be further described, the gate structure G04 of the pull-down transistor PD2 is connected with a gate structure G08 of the pull-up transistor PU2 in the second layer L2. In addition, the source/drain structure SD06 may be coupled to a buried power rail P03 held at the reference voltage VSS lying below the first layer L1 and configured to receive the reference voltage VSS as shown in FIG. 1.

On the other hand, the write pass-gate transistor WPG2 is defined by a gate structure G03, the source/drain structures SD05, an additional source/drain structure SD04, and a channel structure C03 within the second portion of the first layer L1. The gate structure G03 extends in between the pair of source/drain structures SD04, SD05, and the channel structure C03 laterally penetrates through the gate structure G03 and connects with the pair of source/drain structures SD04, SD05. As will be further described, the gate structure G03 is coupled to the write word line WWL (also shown in FIG. 1) lying above the second layer L2. In addition, the source/drain structure SD05 is shared by the pull-down transistor PD2 and the write pass-gate transistor WPG2, while the source/drain structure SD04 may be coupled to the bit line BLB (also shown in FIG. 1) lying above the second layer L2. Further, the source/drain structure SD05 may be coupled to the storage node QB (also shown in FIG. 1).

In the second layer L2 above the first layer L1, the pull-up transistor PU1 is defined by a gate structure G05, a pair of source/drain structures SD07, SD08 and a channel structure C05. The gate structure G05 extends in between the source/drain structures SD07, SD08, and the channel structure C05 laterally penetrates through the gate structure G05 and connects with the source/drain structures SD07, SD08. As will be further described, the gate structure G05 of the pull-up transistor PU1 is connected to the gate structure G01 of the pull-down transistor PD1, and is coupled to the storage node QB. In addition, the source/drain structure SD08 of the pull-up transistor PU1 is electrically connected to the common source/drain structure SD02 of the pull-down transistor PD1 and the write pass-gate transistor WPG1, thus is coupled to the storage node Q. Further, the source/drain structure SD07 of the pull-up transistor PU1 is coupled to a buried power rail P02 held at the power supply voltage VDD lying below the first layer L1 and configured to receive the power supply voltage VDD shown in FIG. 1.

On the other hand, the read pass-gate transistor RPG1 is defined by a gate structure G06, the source/drain structures SD08, an additional source/drain structure SD09, and a channel structure C06 within the second layer L2. The gate structure G06 extends in between the pair of source/drain structures SD08, SD09, and the channel structure C06 laterally penetrates through the gate structure G06 and connects with the pair of source/drain structures SD08, SD09. As will be further described, the gate structure G06 is coupled to the read word line RWL (also shown in FIG. 1) lying above the second layer L2. In addition, the source/drain structure SD08 is shared by the pull-down transistor PU1 and the read pass-gate transistor RPG1, while the source/drain structure SD09 may be coupled to the bit line BL (also shown in FIG. 1) lying above the second layer L2. Further, the source/drain structure SD08 may be coupled to the storage node Q (also shown in FIG. 1).

Similarly, the pull-up transistor PU2 is defined by a gate structure G08, a pair of source/drain structures SD11, SD12 and a channel structure C08. The gate structure G08 extends in between the source/drain structures SD11, SD12, and the channel structure C08 laterally penetrates through the gate structure G08 and connects with the source/drain structures SD11, SD12. As will be further described, the gate structure G08 of the pull-up transistor PU2 is connected to the gate structure G04 of the pull-down transistor PD2, and is coupled to the storage node Q. In addition, the source/drain structure SD11 of the pull-up transistor PU2 is electrically connected to the common source/drain structure SD05 of the pull-down transistor PD2 and the write pass-gate transistor WPG2, thus is coupled to the storage node QB. Further, the source/drain structure SD12 of the pull-up transistor PU2 is coupled to a buried power rail P02 held at the power supply voltage VDD lying below the first layer L1 and configured to receive the power supply voltage VDD as shown in FIG. 1.

On the other hand, the read pass-gate transistor RPG2 is defined by a gate structure G07, the source/drain structures SD11, an additional source/drain structure SD10, and a channel structure C07 within the second layer L2. The gate structure G07 extends in between the pair of source/drain structures SD10, SD11, and the channel structure C07 laterally penetrates through the gate structure G07 and connects with the pair of source/drain structures SD10, SD11. As will be further described, the gate structure G07 is coupled to the read word line RWL (also shown in FIG. 1) lying above the second layer L2. In addition, the source/drain structure SD11 is shared by the pull-down transistor PU2 and the read pass-gate transistor RPG2, while the source/drain structure SD10 may be coupled to the bit line BLB (also shown in FIG. 1) lying above the second layer L2. Further, the source/drain structure SD11 may be coupled to the storage node QB (also shown in FIG. 1).

In some embodiments, the pull-down transistors PD1, PD2 are laterally spaced apart from each other along a first direction D1, and are offset from each other along a second direction D2 perpendicular to the first direction D1. In these embodiments, the source/drain structure SD02 of the pull-down transistor PD1 and the source/drain structure SD05 of the pull-down transistor PD2 may be located between the gate structures G01, G04 of the pull-down transistors PD1, PD2, while the source/drain structure SD01 of the pull-down transistor PD1 and the source/drain structure SD06 of the pull-down transistor PD2 may be located outside a space between the gate structures G01, G04 of the pull-down transistors PD1, PD2.

In addition, the gate structure G01 of the pull-down transistor PD1 may extend to a vicinity of the source/drain structure SD05 of the pull-down transistor PD2 along the second direction D2. In this way, the source/drain structure SD05 of the pull-down transistor PD2 may be electrically connected to the gate structure G01 of the pull-down transistor PD1 by a lateral connection structure LC1. Since the source/drain structure SD05 of the pull-down transistor PD2 is coupled to the storage node QB, the gate structure G01 of the pull-down transistor PD1 electrically connected to the source/drain structure SD05 is also coupled to the storage node QB. Accordingly, the gate structure G05 of the pull-up transistor PU1 within the second layer L2 and connected to the gate structure G01 of the pull-down transistor PD1 (as will be further described) is coupled to the storage node QB as well.

Similarly, the gate structure G04 of the pull-down transistor PD2 may further extend to a vicinity of the source/drain structure SD02 of the pull-down transistor PD1 along the second direction D2. In this way, the source/drain structure SD02 of the pull-down transistor PD1 may be electrically connected to the gate structure G04 of the pull-down transistor PD2 by a lateral connection structure LC2. Since the source/drain structure SD02 of the pull-down transistor PD1 is coupled to the storage node Q, the gate structure G04 of the pull-down transistor PD2 electrically connected to the source/drain structure SD02 is also coupled to the storage node Q. Accordingly, the gate structure G08 of the pull-up transistor PU2 within the second layer and connected to the gate structure G04 of the pull-down transistor PD2 (as will be further described) is coupled to the storage node Q as well.

As compared to a two dimensional memory device, the three dimensional memory device 100 utilizing the CFET may occupy a smaller area on the restricted chip area. Further, by disposing the signal lines (e.g., write word line WWL, read word line RWL, bit lines BL, BLB) above the second layer L2, the three dimensional memory device 100 may further reduce the area overhead. Accordingly, a simple and effective layout of a SRAM device utilizing a CFET is achieved.

It is noted that, in this embodiment, the gate structures G01, G04 of the pull-down transistors PD1, PD2 are extended to be electrically coupled to the storage nodes QB, Q through the lateral connection structures LC1, LC2 and the gate structures G05, G08 of the pull-up transistors PU1, PU2 are electrically coupled to the storage nodes QB, Q through the gate structures G01, G04 of the pull-down transistors PD1, PD2. In another embodiment, the gate structures G05, G08 of the pull-up transistors PU1, PU2 are extended to be electrically coupled to the storage nodes Q, QB through other connection structures and the gate structures G01, G04 of the pull-down transistors PD1, PD2 are electrically coupled to the storage nodes Q, QB through the gate structures G05, G08 of the pull-up transistors PU1, PU2.

Further, these transistors may be electrically coupled to each other, the signal lines (e.g., write word line WWL, read word line RWL, bit line BL, bit line BLB) above the second layer L2 and the buried power rails P01, P02, P03 below the first layer L1 through connection structures. The connection structures may include vertical interconnection structures (e.g., vertical interconnect accesses, VIA), and lateral interconnection structures (e.g., metal-to-drain, MD), but this disclosure does not limit thereto.

Figure 2B:
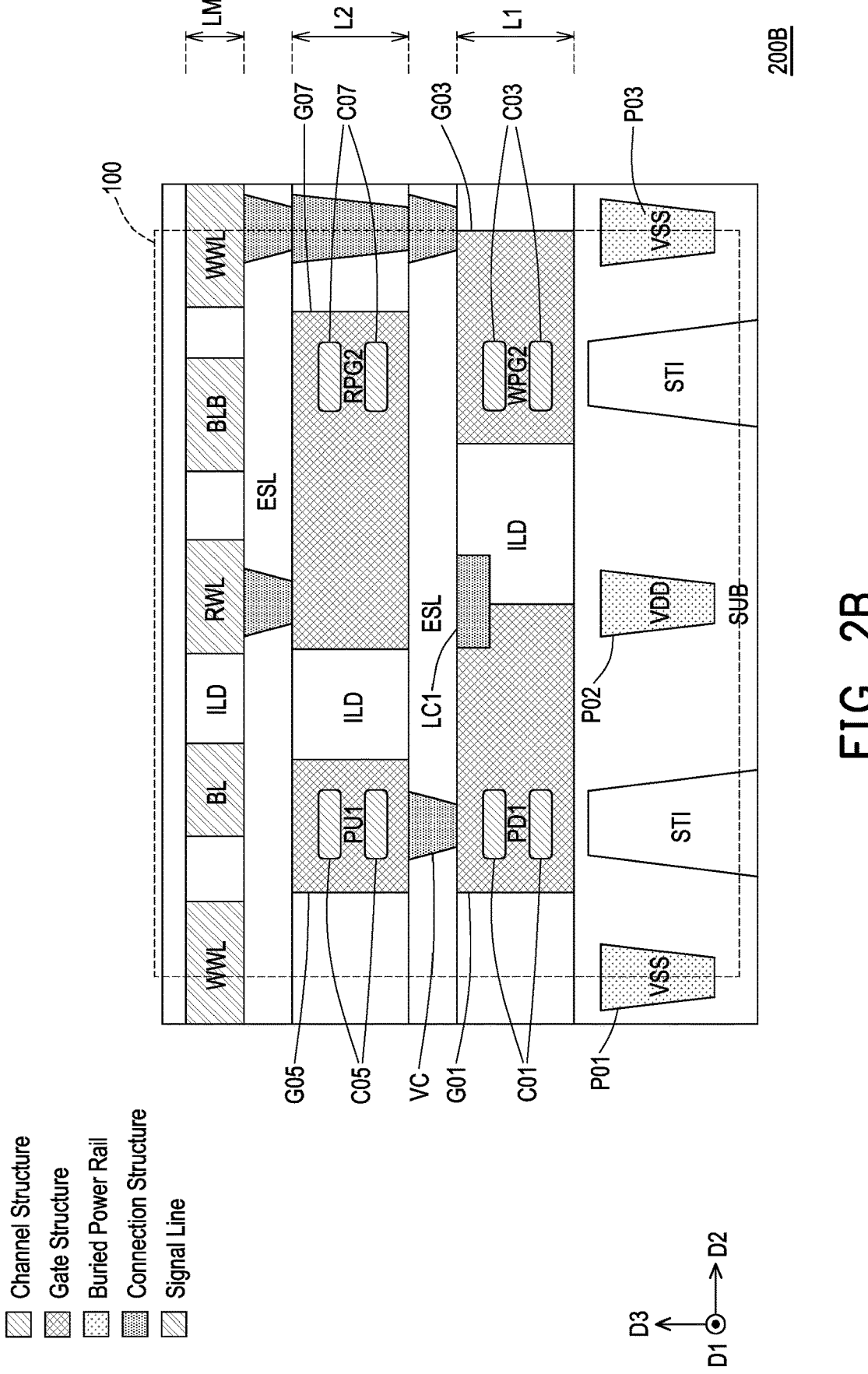
FIG. 2B is a schematic block diagram of a cross-section of a memory device in accordance with some embodiments of the present disclosure.

FIG. 2B is a schematic block diagram of a cross-section of a memory device in accordance with some embodiments of the present disclosure. With reference to FIG. 1 to FIG. 2B, a cross-section 200B depicts a schematic cross-sectional view along line C-C' of the layout 200A in FIG. 2A of the memory device 100 in FIG. 1.

As shown in FIG. 2B, the cross-section 200B may include a substrate SUB, the first layer L1, the second layer L2, and a metallization layer LM. The first layer L1 may be disposed above the substrate SUB, the second layer L2 may be disposed above the first layer L1, and the metallization layer LM may be disposed on the second layer L2. The buried power rails P01, P02, P03 and isolation structures STI (e.g., shallow trench isolation (STI)) may be formed within the substrate SUB while the buried power rails P01, P03 may be held at the reference voltage VS S and the buried power rail P02 may be held at the power supply voltage VDD. The transistors (i.e., the pull-up transistors PU1, PU2, the pull-down transistors PD1, PD2, the write pass-gate transistors WPG1, WPG2, and read pass-gate transistors RPG1, RPG2) may be formed within the first layer L1 and the second layer L2 and the inter-layer dielectric (ILD) structures ILD may be formed between the transistors within the first layer L1 and the second layer L2. The signal lines (i.e., write word line WWL, read word line RWL, bit line BL, bit line BLB) may be formed within the metallization layer LM and the inter-layer dielectric structures ILD may be formed between the signal lines within the metallization layer LM. Etching stop layers ESL may be formed between the first layer L1 and the second layer L2 and between the second layer L2 and the metallization layer LM. Connection structures (e.g., the vertical connection structure VC and the lateral connection structures LC1, LC2) may be formed within the etching stop layer ESL to connect the transistors with the signal lines or the buried power rails P01, P02, P03 and formed within the first layer L1 or the second layer L2 to connect the transistors to each other.

In some embodiments, the pull-down transistors PD1, PD2, the pull-up transistors PU1, PU2, the write pass-gate transistors WPG1, WPG2, and the read pass-gate transistors RPG1, RPG2 are gate-all-around (GAA) transistors. A CFET may be formed of two stacked GAA transistors. That is, CFETs may be formed of the pull-down transistors PD1, PD2, the pull-up transistors PU1, PU2, the write pass-gate transistors WPG1, WPG2, and the read pass-gate transistors RPG1, RPG2.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

As shown in FIG. 2B, a CFET is formed of the pull-down transistor PD1 and the pull-up transistor PU1 above the pull-down transistor PD1. The gate structure G01 of the pull-down transistor PD1 may be coupled to the gate structure G05 of the pull-up transistor PU1 though a vertical connection structure VC (e.g., VIA). A CFET is formed of the write pass-gate transistor WPG2 and the read pass-gate transistor RPG2 above the write pass-gate transistor WPG2. The gate structure G03 of the write pass-gate transistor WPG2 may be coupled to the gate structure G07 of the read pass-gate transistor RPG2 though another vertical connection structure (not shown).

Likewise, not showing in FIG. 2B, a CFET is formed of the pull-down transistor PD2 and the pull-up transistor PU2 above the pull-down transistor PD2. The gate structure G04 of the pull-down transistor PD2 may be coupled to the gate structure G08 of the pull-up transistor PU2 though a vertical connection structure. A CFET is formed of the write pass-gate transistor WPG1 and the read pass-gate transistor RPG1 above the write pass-gate transistor WPG1. The gate structure G02 of the write pass-gate transistor WPG1 may be coupled to the gate structure G06 of the read pass-gate transistor RPG1 though a vertical connection structure.

In these embodiments, the channel structures C01, C02, C03, C04, C05, C06, C07, C08 of these transistors may respectively include a stack of semiconductor sheets/wires. The semiconductor sheets/wires of each transistor are stacked along a vertical direction (i.e., direction D3) perpendicular to the first direction D1 and the second direction D2, and are vertically spaced apart from one another. In this way, each of the semiconductor sheets/wires can be wrapped by the corresponding gate structures G01, G02, G03, G04, G05, G06, G07, G08.

For example, as shown in FIG. 2B, each of the semiconductor sheets/wires of the channel structure C01 of the pull-down transistor PD1 is wrapped by the gate structure G01 of the pull-down transistor PD1 and each of the semiconductor sheets/wires of the channel structure C05 of the pull-up transistor PU1 is wrapped by the gate structure G05 of the pull-up transistor PU1. Each of the semiconductor sheets/wires of the channel structure C03 of the write pass-gate WPG2 is wrapped by the gate structure G03 of the write pass-gate WPG2 and each of the semiconductor sheets/wires of the channel structure C07 of the read pass-gate RPG2 is wrapped by the gate structure G07 of the read pass-gate RPG2.

Likewise, not showing in FIG. 2B, each of the semiconductor sheets/wires of the channel structure C04 of the pull-down transistor PD2 is wrapped by the gate structure G04 of the pull-down transistor PD2 and each of the semiconductor sheets/wires of the channel structure C08 of the pull-up transistor PU2 is wrapped by the gate structure G08 of the pull-up transistor PU2. Each of the semiconductor sheets/wires of the channel structure C02 of the write pass-gate WPG1 is wrapped by the gate structure G02 of the write pass-gate WPG1 and each of the semiconductor sheets/wires of the channel structure C06 of the read pass-gate RPG1 is wrapped by the gate structure G06 of the read pass-gate RPG1.

It is noted that, a sheet number is an amount of the semiconductor sheets/wires of each channel structure G01, G02, G03, G04, G05, G06, G07, G08. A sheet number of a lower transistor of a CFET within the first layer L1 may be same as or different from a sheet number of an upper transistor of the same CFET within the second layer L2. Further, a conductive type of the semiconductor sheets/wires of a lower transistor of a CFET within the first layer L1 may be complementary to a conductive type of the semiconductor sheets/wires of an upper transistor of the same CFET within the second layer L2. Furthermore, the semiconductor sheets/wires of the N-type transistor may be P-type, while the semiconductor sheets/wires of the P-type transistor may be N-type. In some embodiments, a base material of the semiconductor sheets/wires NS includes silicon or a composite semiconductor (e.g., GaAs, InP, GaN or the like). In addition, gate dielectric layers (not shown) may be formed between the semiconductor sheets/wires and the gate structures G01, G02, G03, G04, G05, G06, G07, G08.

In some embodiments, a sheet number of the write pass-gate transistor WPG1 is greater a sheet number of the read pass-gate transistor RPG1 and a sheet number of the write pass-gate transistor WPG2 is greater a sheet number of the read pass-gate transistor RPG2. Since a driving capability (e.g., driving current level) of a GAA transistor increases while a sheet number of the GAA transistor increases, a driving capability of the write pass-gate transistor WPG1 is higher than a driving capability of the read pass-gate transistor RPG1 and a driving capability of the write pass-gate transistor WPG2 is higher than a driving capability of the read pass-gate transistor RPG2. Further, since a static noise margin (SNM) of a GAA transistor increases while a driving capability of the GAA transistor decreases, a static noise margin of the read pass-gate transistor RPG1 is higher than a static noise margin of the write pass-gate transistor WPG1 and a static noise margin of the read pass-gate transistor RPG2 is higher than a static noise margin of the write pass-gate transistor WPG2.

Therefore, in a write operation, a write path through the write pass-gate transistor WPG1 or the write pass-gate transistor WPG2 with a higher driving capability results in a higher write margin (WM) and allows a higher write speed. In a read operation, a read path through the read pass-gate transistor RPG1 or the read pass-gate transistor RPG2 with a lower driving capability results in a good SNM and prevents the selected memory device 100 of the SRAM array from read disturbs. In some embodiments, the write path through the write pass-gate transistor WPG2 and the read path through the read pass-gate transistor RPG2 may be also called an additional write path and an additional read path. In other words, the paths for the write operation and the read operation are separated in the memory device to provide a high-density SRAM design with a good static noise margin and a good write margin.

Moreover, a driving capability of an nFET is higher than a driving capability of a pFET. In some embodiments, the pull-down transistors PD1, PD2 are nFETs and the pull-up transistors PU1, PU2 are pFETs. That is, driving capabilities of the pull-down transistors PD1, PD2 are higher than the driving capabilities of the pull-up transistors PU1, PU2.

Considering the balance between the WM and the SNM (i.e., immunity to read disturbs), the driving capabilities of the pull-down transistors PD1, PD2 are configured to be higher than driving capabilities of the write pass-gate transistors WP1, WP2 and read pass-gate transistor RP1, RP2, and the driving capabilities of the write pass-gate transistors WP1, WP2 and read pass-gate transistor RP1, RP2 are configured to be higher than the driving capabilities of the pull-up transistors PU1, PU2. In this manner, the driving capabilities of the transistors of the memory device 100 may be adjusted for better performance may be achieved. In addition, an area overhead of the memory device 100 can be significantly reduced.

Figure 2C:
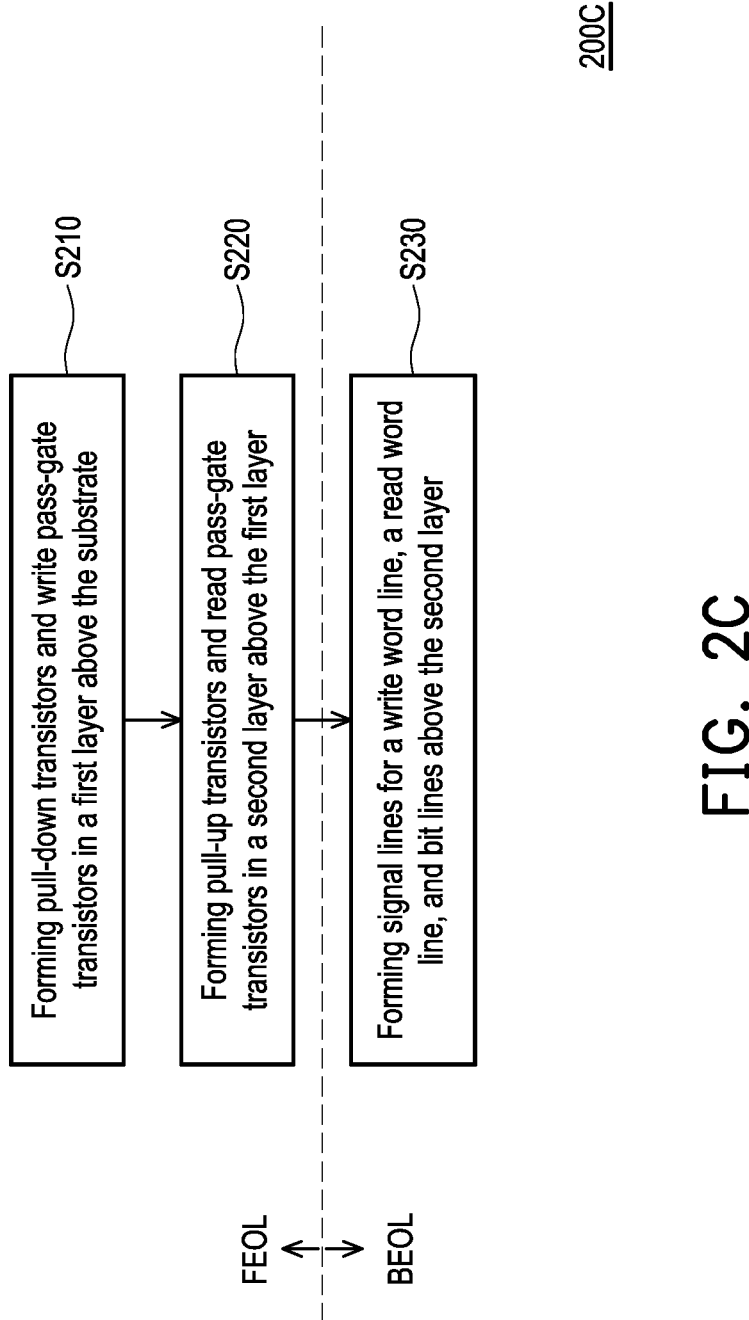
FIG. 2C is a schematic flowchart illustrating a method for forming the memory device shown in FIG. 2A to FIG. 2B in accordance with some embodiments of the present disclosure.

FIG. 2C is a schematic flowchart illustrating a method for forming the memory device shown in FIG. 2A to FIG. 2B in accordance with some embodiments of the present disclosure. With reference to FIG. 1 to FIG. 2C, a method 200C for forming the memory device 100 includes a step S210, a step S220 and a step S230.

In the step S210, the pull-down transistors and PD1, PD2 and the write pass-gate transistors WPG1, WPG2 are formed in the first layer L1 above the substrate SUB. In the step S220, the pull-up transistors PU1, PU2 and the read pass-gate transistors RPG1, RPG2 are formed in the second layer L2 above the first layer L1. In the step S230, the signal lines for the write word line WWL, the read word line RWL, and bit line BL, BLB are formed in the metallization layer LM above the second layer L2.

It has been generally acknowledged that the IC fabrication process is often considered to include a front-end-of-line (FEOL) portion, a middle-end-of-line (MEOL) portion, also called a middle-of-the-line (MOL) portion, and a back-end-of-line (BEOL) portion. FEOL is the first portion of IC fabrication wherein individual active devices are patterned on a semiconductor wafer. FEOL processes include: selecting the type of semiconductor wafer (substrate) to be used; chemical-mechanical planarization and cleaning of the wafer; shallow trench isolation (STI); well formation, gate module formation, and source and drain creation. FEOL does not include the deposition of metal interconnect layers. MEOL processes occur after FEOL processes and include gate contact formation and under bump metallization (UBM) processes. BEOL is the final portion of the IC fabrication process where the individual devices (transistors, capacitors, resistors, etc.) are interconnected with VIAs and conductive traces, e.g., metal lines. BEOL generally begins when the first layer of metal is deposited and includes contacts, insulating layers (dielectrics), metal levels, and bonding sites for chip-to-package connections. In some embodiments, ten or more metal layers are added in the BEOL portion.

It is noted that, the step S210 and the step S220 are performed in the FEOL portion of the fabrication process of the memory device 100 and the step S230 is performed in the BEOL portion of the fabrication process of the memory device 100. That is, the transistors of the memory device 100 are all FEOL transistors. In this manner, the memory device 100 shown in FIG. 2A to FIG. 2B is formed by the method 200C, and an area overhead of the memory device 100 can be significantly reduced.

Figure 3A:
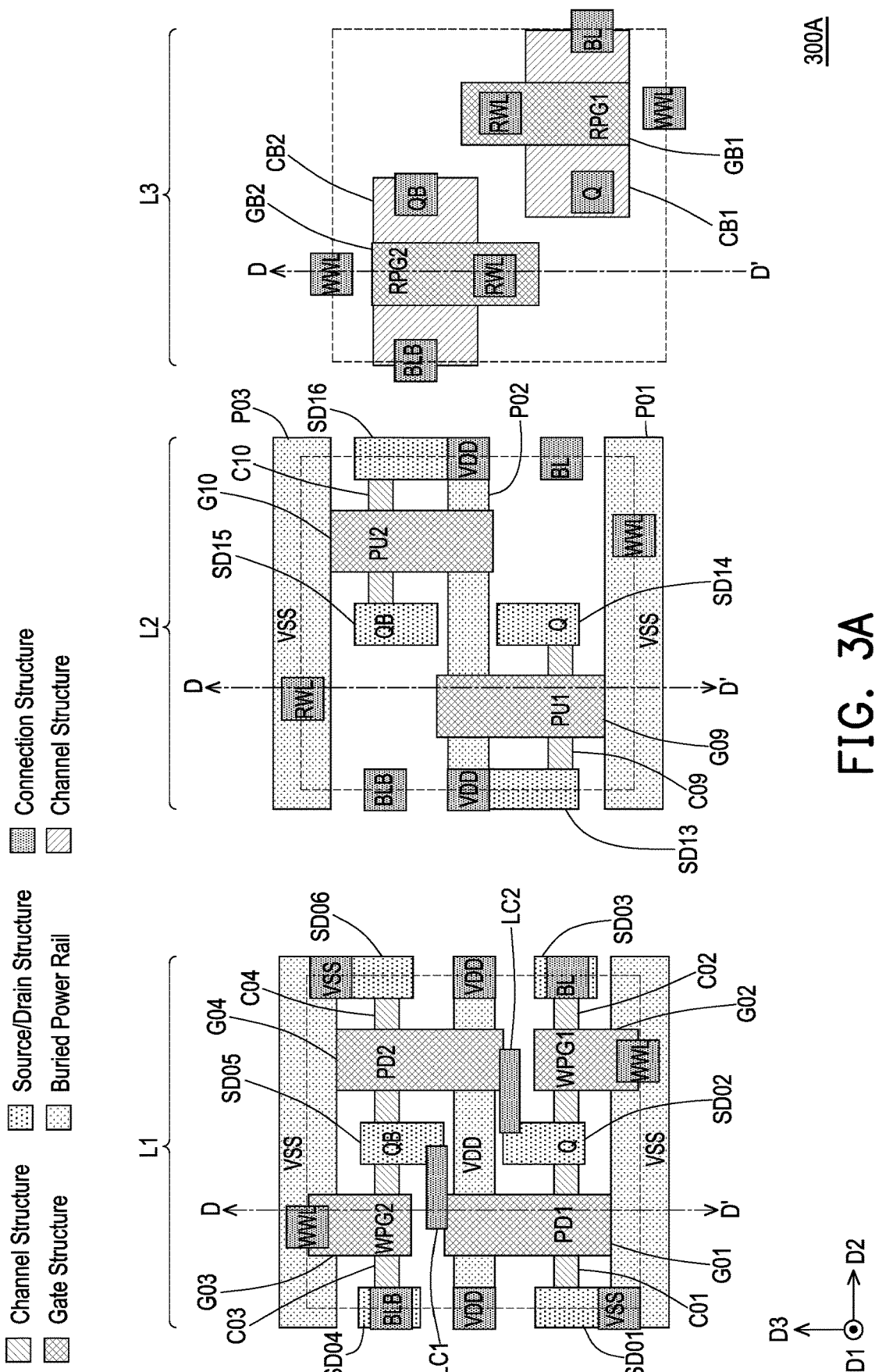
FIG. 3A is a schematic layout diagram of a memory device in accordance with some embodiments of the present disclosure.

FIG. 3A is a schematic layout diagram of a memory device in accordance with some embodiments of the present disclosure. With reference to FIG. 1 and FIG. 3A, a layout 300A of the memory device 100 includes a first layer L1, a second layer L2, and a third layer L3. The write pass-gate transistors WPG1, WPG2 and the pull-down transistors PD1, PD2 may be formed within the first layer L1, whereas the pull-up transistors PU1, PU2 may be formed within the second layer L2 and the read pass-gate transistors RPG1, RPG2 may be formed within the third layer L3. As will be described, the second layer L2 may be disposed above and overlapped with the first layer L1, the third layer L3 may be disposed above and overlapped with the second layer L2, signal lines (e.g., write word line WWL, read word line RWL, bit line BL, bit line BLB) may be disposed above and overlapped with the third layer L3, and buried power rails P01, P02, P03 may be disposed below the first layer L1, such that a footprint area of the memory device 100 can be significantly reduced.

Comparing with the layout 200A of FIG. 2A, the element in the second layer L2 of the layout 200A are separated into two different layers (i.e., the second layer L2 and the third layer L3). Further, instead of all the transistor being GAA transistors, only the pull-down transistors PD1, PD2, the pull-up transistors PU1, PU2, and the write pass-gate transistors WPG1, WPG2, are GAA transistors while the read pass-gate transistors RPG1, RPG2 are planar transistors (e.g., planar FET, thin-film transistor (TFT)). The read pass-gate transistors RPG1, RPG2 may be formed in the BEOL portion of the fabrication process of the memory device 100 and thus are BEOL transistors. In addition, CFETs may be formed of the pull-down transistors PD1, PD2 and the pull-up transistors PU1, PU2.

As shown in FIG. 3A, the pull-down transistor PD1 is defined by a gate structure G01, a pair of source/drain structures SD01, SD02 and a channel structure C01 within a first portion (e.g., lower portion) of the first layer L1. The gate structure G01 extends in between the pair of source/drain structures SD01, SD02, and the channel structure C01 laterally penetrates through the gate structure G01 and connects with the pair of source/drain structures SD01, SD02. As will be further described, the gate structure G01 of the pull-down transistor PD1 is connected with a gate structure G09 of the pull-up transistor PU1 in the second layer L2. In addition, the source/drain structure SD01 may be coupled to a buried power rail P01 held at the reference voltage VSS lying below the first layer L1 and configured to receive the reference voltage VSS as shown in FIG. 1.

On the other hand, the write pass-gate transistor WPG1 is defined by a gate structure G02, the source/drain structures SD02, an additional source/drain structure SD03, and a channel structure C02 within the first portion of the first layer L1. The gate structure G02 extends in between the pair of source/drain structures SD02, SD03, and the channel structure C02 laterally penetrates through the gate structure G02 and connects with the pair of source/drain structures SD02, SD03. As will be further described, the gate structure G02 is coupled to the write word line WWL (also shown in FIG. 1) lying above the second layer L2. In addition, the source/drain structure SD02 is shared by the pull-down transistor PD1 and the write pass-gate transistor WPG1, while the source/drain structure SD03 may be coupled to the bit line BL (also shown in FIG. 1) lying above the second layer L2. Further, the source/drain structure SD02 may be coupled to the storage node Q (also shown in FIG. 1).

Similarly, the pull-down transistor PD2 is defined by a gate structure G04, a pair of source/drain structures SD05, SD06 and a channel structure C04 within a second portion (e.g., upper portion) of the first layer L1. The gate structure G04 extends in between the pair of source/drain structures SD05, SD06, and the channel structure C04 laterally penetrates through the gate structure G04 and connects with the pair of source/drain structures SD05, SD06. As will be further described, the gate structure G04 of the pull-down transistor PD2 is connected with a gate structure G10 of the pull-up transistor PU2 in the second layer L2. In addition, the source/drain structure SD06 may be coupled to a buried power rail P03 held at the reference voltage VSS lying below the first layer L1 and configured to receive the reference voltage VSS as shown in FIG. 1.

On the other hand, the write pass-gate transistor WPG2 is defined by a gate structure G03, the source/drain structures SD05, an additional source/drain structure SD04, and a channel structure C03 within the second portion of the first layer L1. The gate structure G03 extends in between the pair of source/drain structures SD04, SD05, and the channel structure C03 laterally penetrates through the gate structure G03 and connects with the pair of source/drain structures SD04, SD05. As will be further described, the gate structure G03 is coupled to the write word line WWL (also shown in FIG. 1) lying above the second layer L2. In addition, the source/drain structure SD05 is shared by the pull-down transistor PD2 and the write pass-gate transistor WPG2, while the source/drain structure SD04 may be coupled to the bit line BLB (also shown in FIG. 1) lying above the second layer L2. Further, the source/drain structure SD05 may be coupled to the storage node QB (also shown in FIG. 1).

In the second layer L2 above the first layer L1, the pull-up transistor PU1 is defined by a gate structure G09, a pair of source/drain structures SD13, SD14 and a channel structure C09. The gate structure G09 extends in between the source/drain structures SD13, SD14, and the channel structure C09 laterally penetrates through the gate structure G09 and connects with the source/drain structures SD13, SD14. As will be further described, the gate structure G09 of the pull-up transistor PU1 is connected to the gate structure G01 of the pull-down transistor PD1, and is coupled to the storage node QB. In addition, the source/drain structure SD14 of the pull-up transistor PU1 is electrically connected to the common source/drain structure SD02 of the pull-down transistor PD1 and the write pass-gate transistor WPG1, thus is coupled to the storage node Q. Further, the source/drain structure SD13 of the pull-up transistor PU1 is coupled to a buried power rail P02 held at the power supply voltage VDD lying below the first layer L1 and configured to receive the power supply voltage VDD shown in FIG. 1.

Similarly, the pull-up transistor PU2 is defined by a gate structure G10, a pair of source/drain structures SD15, SD16 and a channel structure C10 within the second layer L2. The gate structure G10 extends in between the source/drain structures SD15, SD16, and the channel structure C10 laterally penetrates through the gate structure G10 and connects with the source/drain structures SD15, SD16. As will be further described, the gate structure G10 of the pull-up transistor PU2 is connected to the gate structure G04 of the pull-down transistor PD2, and is coupled to the storage node Q. In addition, the source/drain structure SD15 of the pull-up transistor PU2 is electrically connected to the common source/drain structure SD05 of the pull-down transistor PD2 and the write pass-gate transistor WPG2, thus is coupled to the storage node QB. Further, the source/drain structure SD16 of the pull-up transistor PU2 is coupled to a buried power rail P02 held at the power supply voltage VDD lying below the first layer L1 and configured to receive the power supply voltage VDD as shown in FIG. 1.

In the third layer L3 above the second layer L2, the read pass-gate transistor RPG1, which is a BEOL transistor, is defined by a gate structure GB1 and a channel structures CB1 within the third layer L3. The gate structure GB1 extends along the second direction above and in between a pair of source/drain regions of the channel structure CB1 and the pair of source/drain regions are disposed on opposite sides of the channel structure CB1 along the first direction D1. As will be further described, one of the source/drain region is electrically coupled to the storage node Q and another one of the source/drain region is electrically coupled to the bit line BL lying above the third layer L3. Further, the gate structure GB1 is electrically coupled to the read word line RWL lying above the third layer L3.

Similarly, the read pass-gate transistor RPG2, which is a BEOL transistor, is defined by a gate structure GB2 and a channel structures CB2 within the third layer L3. The gate structure GB2 extends along the second direction above and in between a pair of source/drain regions of the channel structure CB2 and the pair of source/drain regions are disposed on opposite sides of the channel structure CB2 along the first direction D1. As will be further described, one of the source/drain region is electrically coupled to the storage node QB and another one of the source/drain region is electrically coupled to the bit line BLB lying above the third layer L3. Further, the gate structure GB2 is electrically coupled to the read word line RWL lying above the third layer L3.

In some embodiments, the pull-down transistors PD1, PD2 are laterally spaced apart from each other along a first direction D1, and are offset from each other along a second direction D2 perpendicular to the first direction D1. In these embodiments, the source/drain structure SD02 of the pull-down transistor PD1 and the source/drain structure SD05 of the pull-down transistor PD2 may be located between the gate structures G01, G04 of the pull-down transistors PD1, PD2, while the source/drain structure SD01 of the pull-down transistor PD1 and the source/drain structure SD06 of the pull-down transistor PD2 may be located outside a space between the gate structures G01, G04 of the pull-down transistors PD1, PD2.

In addition, the gate structure G01 of the pull-down transistor PD1 may extend to a vicinity of the source/drain structure SD05 of the pull-down transistor PD2 along the second direction D2. In this way, the source/drain structure SD05 of the pull-down transistor PD2 may be electrically connected to the gate structure G01 of the pull-down transistor PD1 by a lateral connection structure LC1. Since the source/drain structure SD05 of the pull-down transistor PD2 is coupled to the storage node QB, the gate structure G01 of the pull-down transistor PD1 electrically connected to the source/drain structure SD05 is also coupled to the storage node QB. Accordingly, the gate structure G09 of the pull-up transistor PU1 within the second layer L2 and connected to the gate structure G01 of the pull-down transistor PD1 (as will be further described) is coupled to the storage node QB as well.

Similarly, the gate structure G04 of the pull-down transistor PD2 may further extend to a vicinity of the source/drain structure SD02 of the pull-down transistor PD1 along the second direction D2. In this way, the source/drain structure SD02 of the pull-down transistor PD1 may be electrically connected to the gate structure G04 of the pull-down transistor PD2 by a lateral connection structure LC2. Since the source/drain structure SD02 of the pull-down transistor PD1 is coupled to the storage node Q, the gate structure G04 of the pull-down transistor PD2 electrically connected to the source/drain structure SD02 is also coupled to the storage node Q. Accordingly, the gate structure G10 of the pull-up transistor PU2 within the second layer and connected to the gate structure G04 of the pull-down transistor PD2 (as will be further described) is coupled to the storage node Q as well.

It is noted that, in this embodiment, the gate structures G01, G04 of the pull-down transistors PD1, PD2 are extended to be electrically coupled to the storage nodes QB, Q through the lateral connection structures LC1, LC2 and the gate structures G05, G08 of the pull-up transistors PU1, PU2 are electrically coupled to the storage nodes QB, Q through the gate structures G01, G04 of the pull-down transistors PD1, PD2. In another embodiment, the gate structures G09, G10 of the pull-up transistors PU1, PU2 are extended to be electrically coupled to the storage nodes Q, QB through other connection structures and the gate structures G01, G04 of the pull-down transistors PD1, PD2 are electrically coupled to the storage nodes Q, QB through the gate structures G09, G10 of the pull-up transistors PU1, PU2.

Further, these transistors may be electrically coupled to each other, the signal lines (e.g., write word line WWL, read word line RWL, bit line BL, bit line BLB) above the third layer L3 and the buried power rails P01, P02, P03 below the first layer L1 through connection structures. The connection structures may include vertical interconnection structures (e.g., vertical interconnect accesses, VIA), and lateral interconnection structures (e.g., metal-to-drain, MD), but this disclosure does not limit thereto.

As compared to a two dimensional memory device, the three dimensional memory device 100 utilizing the CFETs and BEOL transistors may occupy a smaller area on the restricted chip area. Further, by disposing the signal lines (e.g., write word line WWL, read word line RWL, bit lines BL, BLB) above the third layer L3, the three dimensional memory device 100 may further reduce the area overhead. Furthermore, by using three-layer structure, the issues of routing congestion may be also reduced. Accordingly, a simple and effective layout of a SRAM device utilizing a CFET is achieved.

Moreover, a driving capability (e.g., driving current level) of the BEOL transistor is smaller than a driving capability of the GAA transistor. That is, a driving capability of the read pass-gate transistor RPG1 is smaller than a driving capability of the write pass-gate transistor WPG1 and a driving capability of the read pass-gate transistor RPG2 is smaller than a driving capability of the write pass-gate transistor WPG2. Since a static noise margin (SNM) of a transistor increases while a driving capability of the transistor decreases, a static noise margin of the read pass-gate transistor RPG1 is higher than a static noise margin of the write pass-gate transistor WPG1 and a static noise margin of the read pass-gate transistor RPG2 is higher than a static noise margin of the write pass-gate transistor WPG2. Further, since a write margin (WM) of a transistor increases while a driving capability of the transistor increases, a write margin of the write pass-gate transistor WPG1 is higher than a write margin of the read pass-gate transistor RPG1 and a write margin of the write pass-gate transistor WPG2 is higher than a write margin of the read pass-gate transistor RPG2.

Therefore, in a write operation, a write path through the write pass-gate transistor WPG1 or the write pass-gate transistor WPG2 with a higher driving capability results in a higher write margin (WM) and allows a higher write speed. In a read operation, a read path through the read pass-gate transistor RPG1 or the read pass-gate transistor RPG2 with a lower driving capability results in a good SNM and prevents the select memory device 100 of the SRAM array from read disturbs. In some embodiments, the write path through the write pass-gate transistor WPG2 and the read path through the read pass-gate transistor RPG2 may be also called an additional write path and an additional read path.

In other words, the paths for the write operation and the read operation are separated in the memory device to provide a high-density SRAM design with a good static noise margin and a good write margin.

Figure 3B:
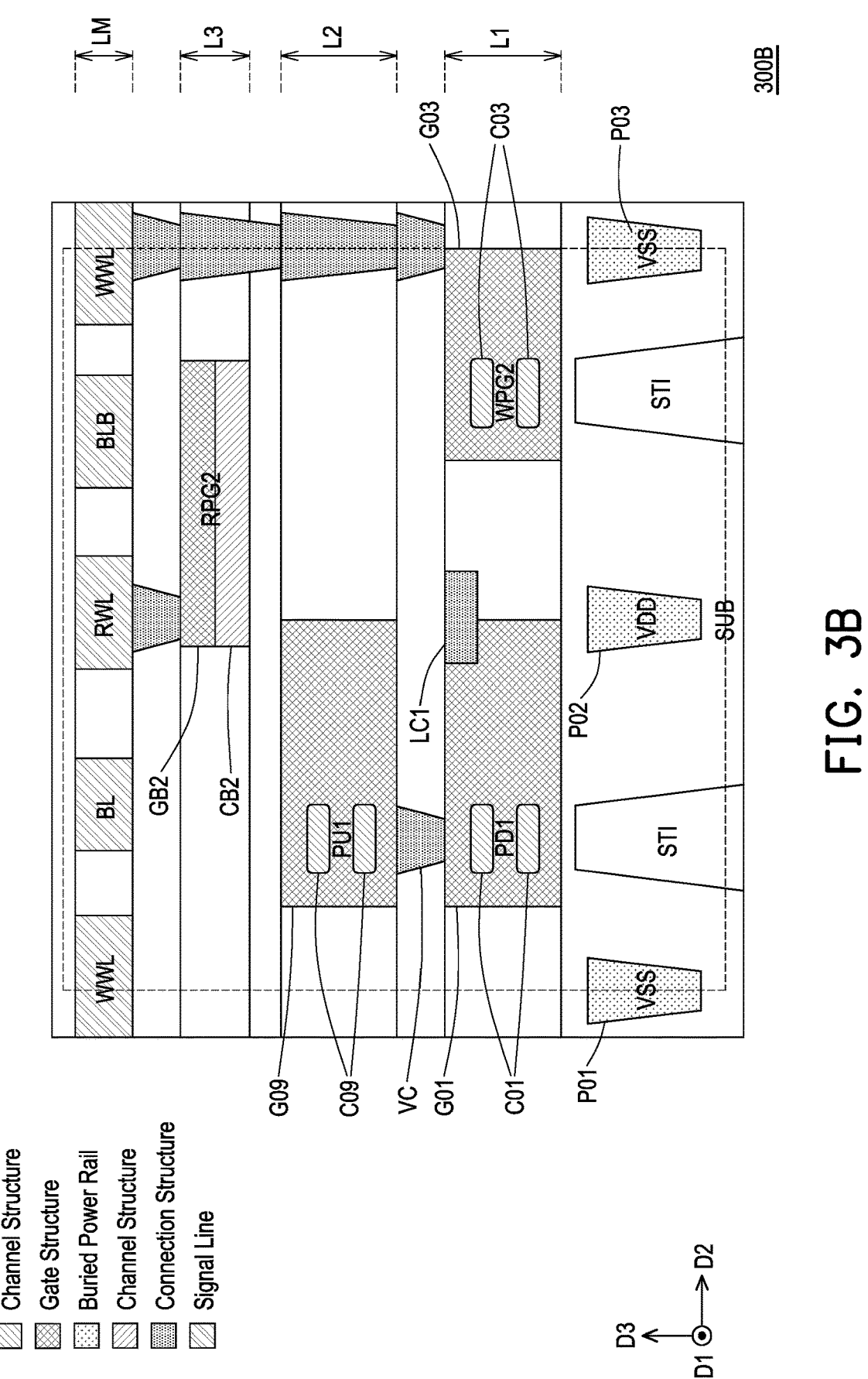
FIG. 3B is a schematic block diagram of a cross-section of a memory device in accordance with some embodiments of the present disclosure.

FIG. 3B is a schematic block diagram of a cross-section of a memory device in accordance with some embodiments of the present disclosure. With reference to FIG. 1, FIG. 3A and FIG. 3B, a cross-section 300B depicts a schematic cross-sectional view along line D-D' of the layout 300A in FIG. 3A of the memory device 100 in FIG. 1.

As shown in FIG. 3B, the cross-section 300B may include a substrate SUB, the first layer L1, the second layer L2, the third layer L3, and a metallization layer LM. The first layer L1 may be disposed above the substrate SUB, the second layer L2 may be disposed above the first layer L1, the third layer L3 may be disposed above the second layer L2, and the metallization layer LM may be disposed on the third layer L3. The buried power rails P01, P02, P03 and isolation structures STI (e.g., shallow trench isolation (STI)) may be formed within the substrate SUB while the buried power rails P01, P03 may be held at the reference voltage VSS and the buried power rail P02 may be held at the power supply voltage VDD. The transistors (i.e., the pull-up transistors PU1, PU2, the pull-down transistors PD1, PD2, the write pass-gate transistors WPG1, WPG2, and read pass-gate transistors RPG1, RPG2) may be formed within the first layer L1, the second layer L2, and the third layer L3 and the inter-layer dielectric (ILD) structures ILD may be formed between the transistors within the first layer L1, the second layer L2, and the third layer L3. The signal lines (i.e., write word line WWL, read word line RWL, bit line BL, bit line BLB) may be formed within the metallization layer LM and the inter-layer dielectric structures ILD may be formed between the signal lines within the metallization layer LM. Etching stop layers ESL may be formed between the first layer L1 and the second layer L2, between the second layer L2 and the third layer L3, and between the third layer L3 and the metallization layer LM. Connection structures (e.g., the vertical connection structure VC and the lateral connection structures LC1, LC2) may be formed within the etching stop layer ESL to connect the transistors with the signal lines the buried power rails P01, P02, P03 and formed within the first layer L1, the second layer L2, or the third layer L3 to connect the transistors to each other.

As described in the description of FIG. 3A, the pull-down transistors PD1, PD2, the pull-up transistors PU1, PU2, and the write pass-gate transistors WPG1, WPG2 are gate-all-around (GAA) transistors. The read pass-gate transistors RPG1, RPG2 are BEOL transistors. Since a CFET may be formed of two stacked GAA transistors, CFETs may be formed of the pull-down transistors PD1, PD2, and the pull-up transistors PU1, PU2.

As shown in FIG. 3B, a CFET is formed of the pull-down transistor PD1 and the pull-up transistor PU1 above the pull-down transistor PD1. The gate structure G01 of the pull-down transistor PD1 may be coupled to the gate structure G09 of the pull-up transistor PU1 though a vertical connection structure VC (e.g., VIA). Likewise, a CFET is formed of the pull-down transistor PD2 and the pull-up transistor PU2 above the pull-down transistor PD2. The gate structure G04 of the pull-down transistor PD2 may be coupled to the gate structure G10 of the pull-up transistor PU2 though a vertical connection structure.

In these embodiments, the channel structures C01, C04, C09, C10, C02, C03 of the pull-down transistors PD1, PD2, pull-up transistors PU1, PU2, and the write pass-gate transistors WPG1, WPG2 may respectively include a stack of semiconductor sheets/wires. The semiconductor sheets/wires of each transistor are stacked along a vertical direction (i.e., direction D3) perpendicular to the first direction D1 and the second direction D2, and are vertically spaced apart from one another. In this way, each of the semiconductor sheets/wires can be wrapped by the corresponding gate structures G01, G04, G09, G10, G02, G03 of the pull-down transistors PD1, PD2, pull-up transistors PU1, PU2, and the write pass-gate transistors WPG1, WPG2.

For example, as shown in FIG. 3B, each of the semiconductor sheets/wires of the channel structure C01 of the pull-down transistor PD1 is wrapped by the gate structure G01 of the pull-down transistor PD1 and each of the semiconductor sheets/wires of the channel structure C09 of the pull-up transistor PU1 is wrapped by the gate structure G09 of the pull-up transistor PU1. Each of the semiconductor sheets/wires of the channel structure C03 of the write pass-gate WPG2 is wrapped by the gate structure G03 of the write pass-gate WPG2. Likewise, not showing in FIG. 3B, each of the semiconductor sheets/wires of the channel structure C04 of the pull-down transistor PD2 is wrapped by the gate structure G04 of the pull-down transistor PD2 and each of the semiconductor sheets/wires of the channel structure C10 of the pull-up transistor PU2 is wrapped by the gate structure G10 of the pull-up transistor PU2. Each of the semiconductor sheets/wires of the channel structure C02 of the write pass-gate WPG1 is wrapped by the gate structure G02 of the write pass-gate WPG1.

In some embodiments, as shown in FIG. 3B, the read pass-gate transistor RPG2 is a top gate transistor. That is, the gate structure GB2 of the read pass-gate transistor RPG2 is disposed above the channel structure CB2 of the read pass-gate transistor RPG2. The gate structure GB2 of the read pass-gate transistor RPG2 is electrically coupled to the read word line within the metallization layer LM through a connection structure (e.g., VIA) and the source/drain region of the channel structure CB2 of the read pass-gate transistor RPG2 are electrically coupled to the bit line BLB within the metallization layer LM and the storage node QB through connection structure (not shown). Likewise, not showing in FIG. 3B, the read pass-gate transistor RPG1 is a top gate transistor. That is, the gate structure GB1 of the read pass-gate transistor RPG1 is disposed above the channel structure CB1 of the read pass-gate transistor RPG1. The gate structure GB1 of the read pass-gate transistor RPG1 is electrically coupled to the read word line within the metallization layer LM through a connection structure (e.g., VIA) and the source/drain region of the channel structure CB1 of the read pass-gate transistor RPG1 are electrically coupled to the bit line BL within the metallization layer LM and the storage node Q through connection structure (not shown).

It is noted that, a sheet number is an amount of the semiconductor sheets/wires of each channel structure gate structure G01, G04, G09, G10, G02, G03 of the pull-down transistors PD1, PD2, pull-up transistors PU1, PU2, and the write pass-gate transistors WPG1, WPG2. Further, while a sheet number of a GAA transistor increases, a driving capability of the GAA transistor increases and thus a write margin (WM) of the GAA transistors increases. However, while a sheet number of a GAA transistor increases, a static noise margin (SNM) of the GAA transistor may decrease. Moreover, a driving capability of a planar BEOL transistor is smaller than a GAA transistor.

Therefore, considering the balance between the WM and the SNM (i.e., immunity to read disturbs), the driving capabilities of the pull-down transistors PD1, PD2 are configured to be higher than driving capabilities of the write pass-gate transistors WP1, WP2 and read pass-gate transistor RP1, RP2, and the driving capabilities of the write pass-gate transistors WP1, WP2 and read pass-gate transistor RP1, RP2 are configured to be higher than the driving capabilities of the pull-up transistors PU1, PU2. By using the planar BEOL transistors as the read pass-gate transistors RPG1, RPG2, the SNM of the read operation may be assured. In this manner, the driving capabilities of the transistors of the memory device 100 may be adjusted for better performance may be achieved. In addition, an area overhead of the memory device 100 can be significantly reduced.

Figure 3C:
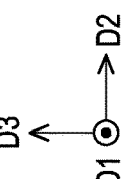
FIG. 3C is a schematic block diagram of a cross-section of a memory device in accordance with some embodiments of the present disclosure.

FIG. 3C is a schematic block diagram of a cross-section of a memory device in accordance with some embodiments of the present disclosure. With reference to FIG. 1, FIG. 3A, FIG. 3B, and FIG. 3C, a cross-section 300C depicts a schematic cross-sectional view along line D-D' of the layout 300A in FIG. 3A of the memory device 100 in FIG. 1. Compared with the cross-section 300B of FIG. 3B, the second layer L2 of the cross-section 300C of FIG. 3C is directly disposed above the first layer L1 without disposing an etching stop layer ESL between the first layer L1 and the second layer L2. In other words, the CFETs of the cross-section 300B are bi-layer gate CFETs and the CFETs of the cross-section 300C are single-layer gate CFETs. In this manner, the height of the memory device 100 may be reduced. It is noted that, the rest of the details have been described in the embodiments mentioned above, while the details are not redundantly described seriatim herein.

As compared to a two dimensional memory device, the three dimensional memory device 100 utilizing the CFETs and the BEOL transistors may occupy a smaller area on the restricted chip area. Further, by disposing the signal lines (e.g., write word line WWL, read word line RWL, bit lines BL, BLB) above the third layer L3, the three dimensional memory device 100 may further reduce the area overhead. Furthermore, by using three-layer structure, the issues of routing congestion may be also reduced. Accordingly, a simple and effective layout of a SRAM device utilizing the CFETs and the BEOL transistors is achieved.

Figure 3D:
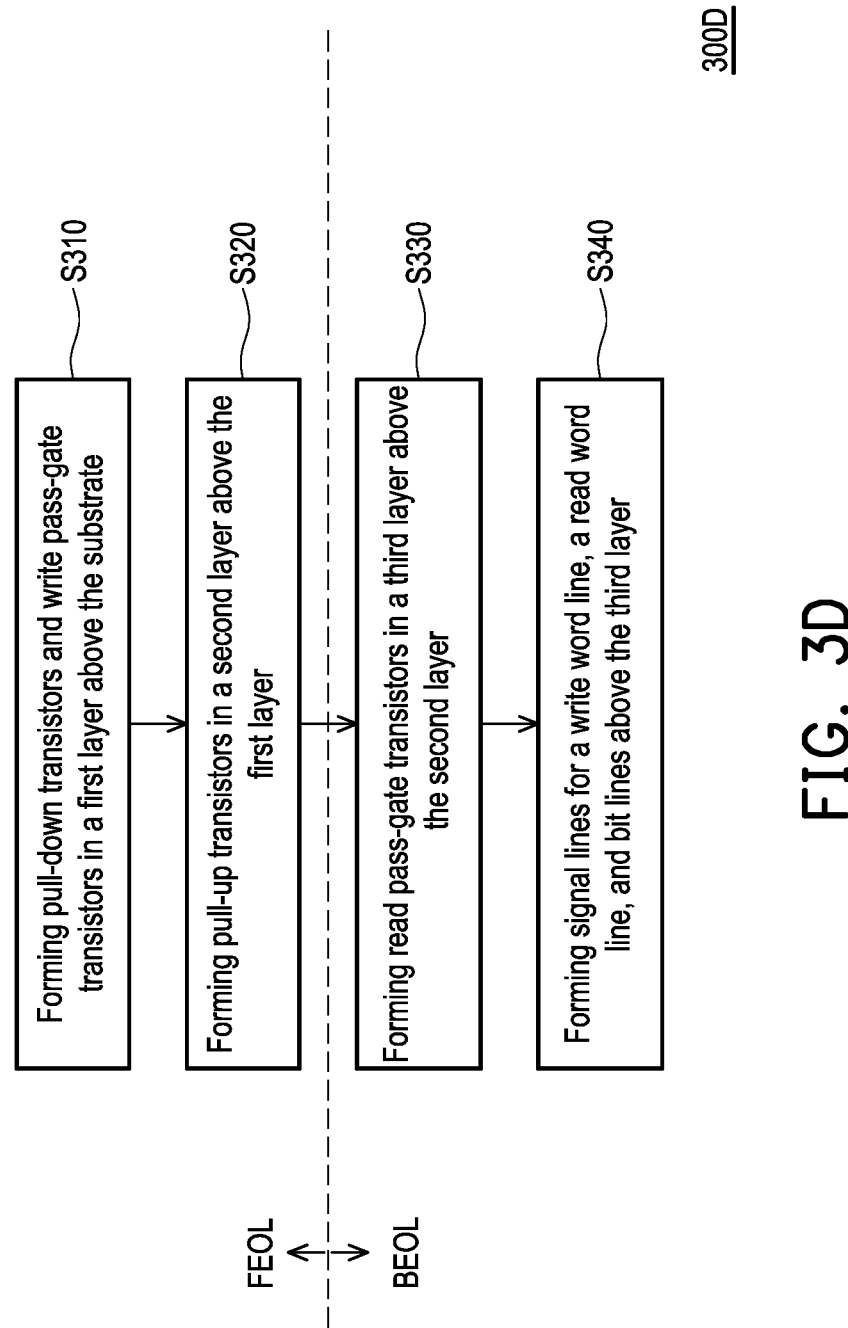
FIG. 3D is a schematic flowchart illustrating a method for forming the memory device shown in FIG. 3A to FIG. 3C in accordance with some embodiments of the present disclosure.

FIG. 3D is a schematic flowchart illustrating a method for forming the memory device shown in FIG. 3A to FIG. 3C in accordance with some embodiments of the present disclosure. With reference to FIG. 1, FIG. 3A, FIG. 3B and FIG. 3C, a method 300D for forming the memory device 100 includes a step S310, a step S320, a step S330 and a step S340.

In the step S310, the pull-down transistors and PD1, PD2 and the write pass-gate transistors WPG1, WPG2 are formed in the first layer L1 above the substrate SUB. In the step S320, the pull-up transistors PU1, PU2 are formed in the second layer L2 above the first layer L1. In the step S330, the read pass-gate transistors RPG1, RPG2 are form in the third layer L3 above the second layer L2. In the step S340, the signal lines for the write word line WWL, the read word line RWL, and bit line BL, BLB are formed in the metallization layer LM above the third layer L3.

It is noted that, the step S310 and the step S320 are performed in the FEOL portion of the fabrication process of the memory device 100 and the step S330 and the step S340 are performed in the BEOL portion of the fabrication process of the memory device 100. That is, the pull-down transistors PD1, PD2, pull-up transistors PU1, PU2, and the write pass-gate transistors WPG1, WPG2 of the memory device 100 are FEOL transistors and the read pass-gate transistors RPG1, RPG2 are BEOL transistors. In this manner, the memory device 100 shown in FIG. 3A to FIG. 3C is formed by the method 300D, and an area overhead of the memory device 100 can be significantly reduced.

Figure 4A:
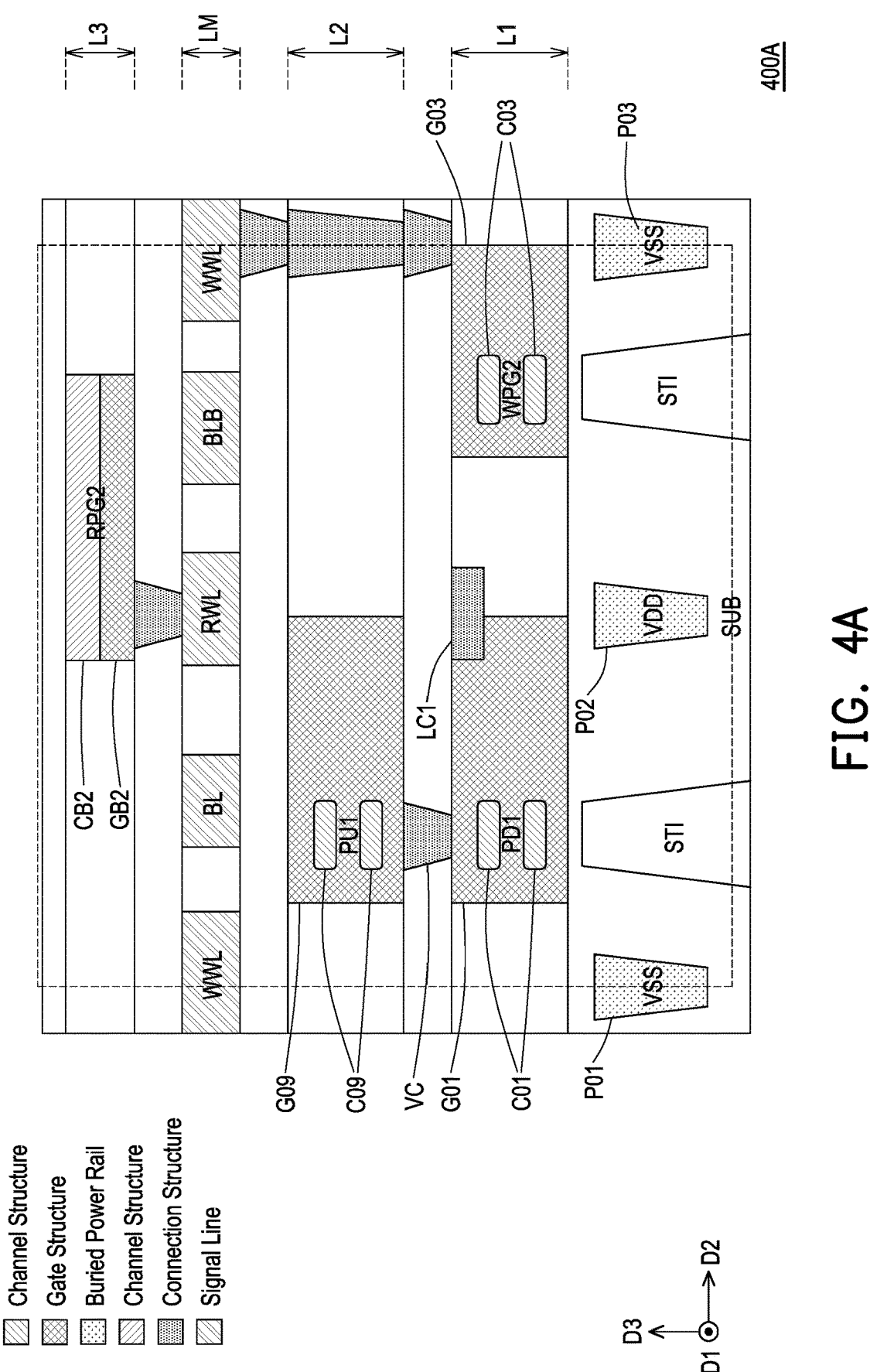
FIG. 4A is a schematic block diagram of a cross-section of a memory device in accordance with some embodiments of the present disclosure.

FIG. 4A is a schematic block diagram of a cross-section of a memory device in accordance with some embodiments of the present disclosure. With reference to FIG. 1, FIG. 3A, and FIG. 4C, a cross-section 400A depicts a schematic cross-sectional view along line D-D' of the layout 300A in FIG. 3A of the memory device 100 in FIG. 1. Compared with the cross-section 300B of FIG. 3B, the read pass-gate transistors of the cross-section 400A of FIG. 4A are bottom gate transistors instead of top gate transistors and the metallization layer LM of the cross-section 400A of FIG. 4A is disposed between the second layer L2 and the third layer L3 instead of being disposed above the third layer L3. In this manner, as shown in FIG. 4A, the routing (connection structures) from the write pass-gate transistors WPG1, WPG2 to the write word line WWL may decrease. Further, not showing in FIG. 4A, the routing from the bit lines BL, BLB to the write pass-gate transistors WPG1, WPG2 may also decrease. Therefore, the cost of the memory device 100 may be reduced while a high density of the memory device 100 is achieved. It is noted that, the rest of the details have been described in the embodiments mentioned above, while the details are not redundantly described seriatim herein.

As compared to a two dimensional memory device, the three dimensional memory device 100 utilizing the CFETs and the bottom gate BEOL transistors may occupy a smaller area on the restricted chip area. Further, by disposing the signal lines (e.g., write word line WWL, read word line RWL, bit lines BL, BLB) between the second layer L2 and the third layer L3, the three dimensional memory device 100 may further reduce the area overhead and the cost of the memory device is also reduced. Furthermore, by using three-layer structure, the issues of routing congestion may be also reduced. Accordingly, a simple and effective layout of a SRAM device utilizing the CFETs and the bottom gate BEOL transistors is achieved.

Figure 4B:
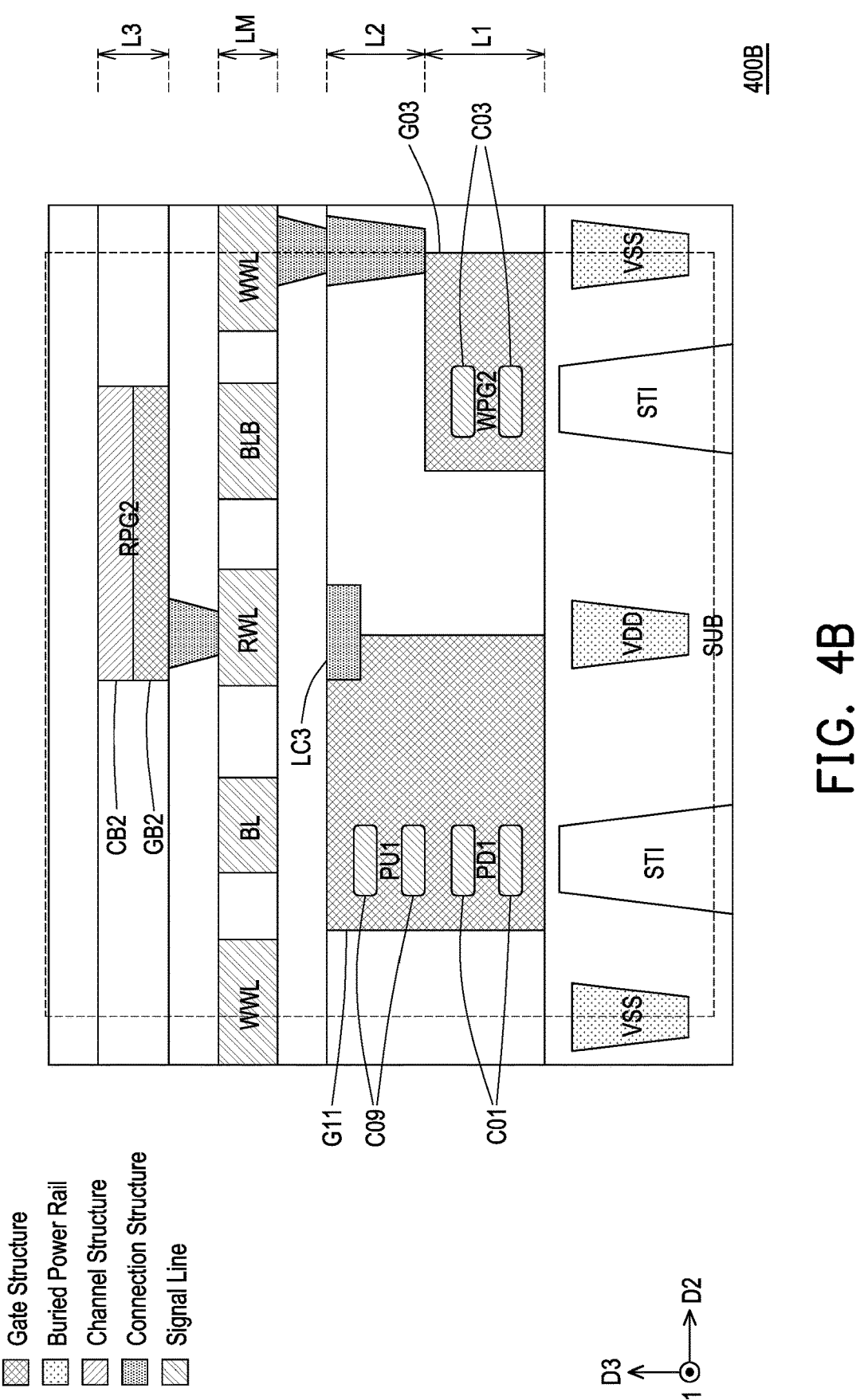
FIG. 4B is a schematic block diagram of a cross-section of a memory device in accordance with some embodiments of the present disclosure.
Figure 4C:
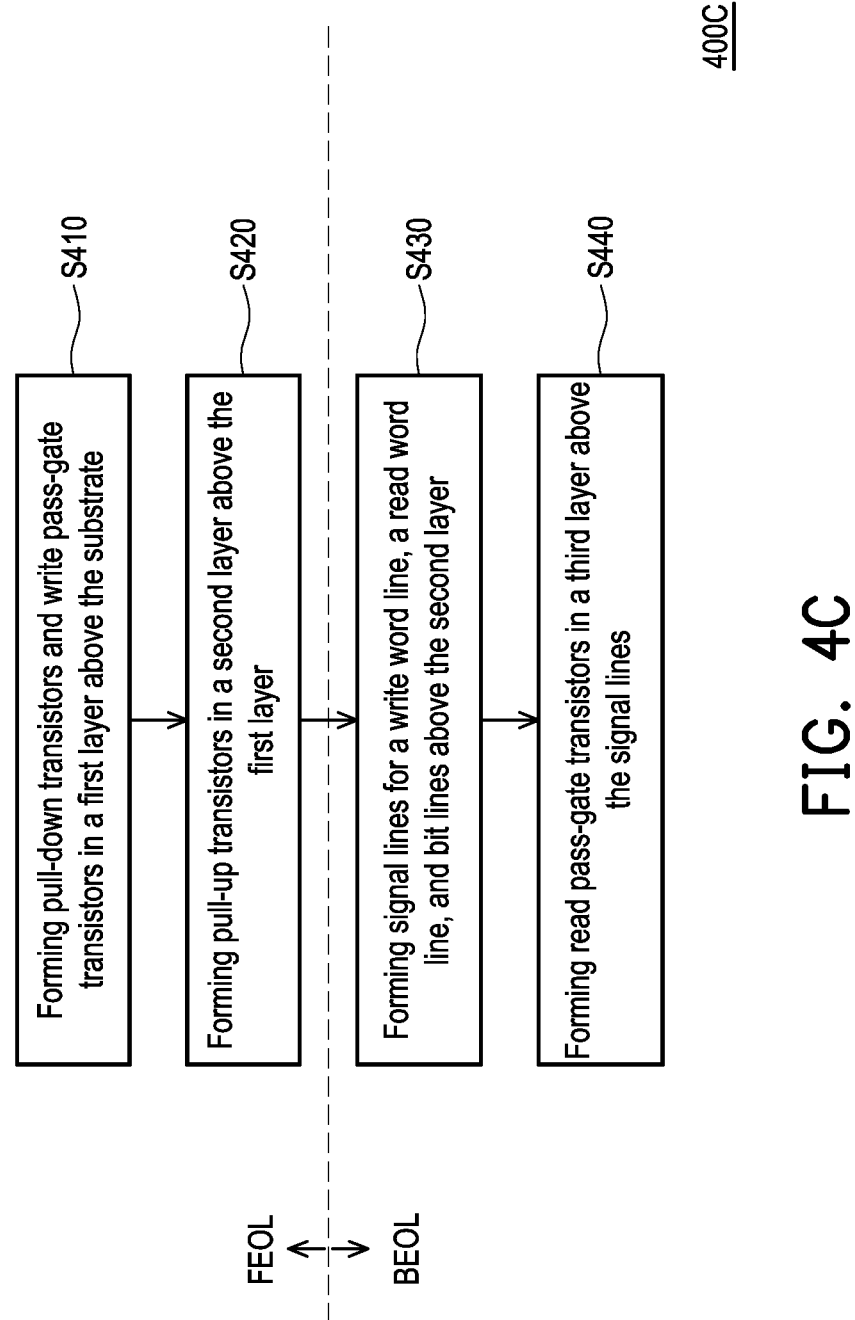
FIG. 4C is a schematic flowchart illustrating a method for forming the memory device shown in FIG. 4A to FIG. 4B in accordance with some embodiments of the present disclosure.

FIG. 4B is a schematic block diagram of a cross-section of a memory device in accordance with some embodiments of the present disclosure. With reference to FIG. 1, FIG. 3A, FIG. 4A, and FIG. 4B, a cross-section 400B depicts a schematic cross-sectional view along line D-D' of the layout 300A in FIG. 3A of the memory device 100 in FIG. 1. Compared with the cross-section 400A of FIG. 4A, the second layer L2 of the cross-section 400B of FIG. 4B is directly disposed above the first layer L1 without disposing an etching stop layer ESL between the first layer L1 and the second layer L2. In other words, the CFETs of the cross-section 400A are bi-layer gate CFETs and the CFETs of the cross-section 400B are single-layer gate CFETs. In this manner, the height of the memory device 100 may be reduced. It is noted that, the rest of the details have been described in the embodiments mentioned above, while the details are not redundantly described seriatim herein.

As compared to a two dimensional memory device, the three dimensional memory device 100 utilizing the CFETs and the bottom gate BEOL transistors may occupy a smaller area on the restricted chip area. Further, by disposing the signal lines (e.g., write word line WWL, read word line RWL, bit lines BL, BLB) between the second layer L2 and the third layer L3, the three dimensional memory device 100 may further reduce the area overhead. Furthermore, by using three-layer structure, the issues of routing congestion may be also reduced. Accordingly, a simple and effective layout of a SRAM device utilizing the CFETs and the bottom gate BEOL transistors is achieved.

FIG. 4C is a schematic flowchart illustrating a method for forming the memory device shown in FIG. 4A to FIG. 4B in accordance with some embodiments of the present disclosure. With reference to FIG. 1, FIG. 3A, FIG. 4A and FIG. 4B, a method 400C for forming the memory device 100 includes a step S410, a step S420, a step S430 and a step S440.

In the step S410, the pull-down transistors and PD1, PD2 and the write pass-gate transistors WPG1, WPG2 are formed in the first layer L1 above the substrate SUB. In the step S420, the pull-up transistors PU1, PU2 are formed in the second layer L2 above the first layer L1. In the step S430, the signal lines for the write word line WWL, the read word line RWL, and bit line BL, BLB are formed in the metallization layer LM above the third layer L2. In the step S440, the read pass-gate transistors RPG1, RPG2 are form in the third layer L3 above the metallization layer LM.

It is noted that, the step S410 and the step S420 are performed in the FEOL portion of the fabrication process of the memory device 100 and the step S430 and the step S440 are performed in the BEOL portion of the fabrication process of the memory device 100. That is, the pull-down transistors PD1, PD2, pull-up transistors PU1, PU2, and the write pass-gate transistors WPG1, WPG2 of the memory device 100 are FEOL transistors and the read pass-gate transistors RPG1, RPG2 are BEOL transistors. In this manner, the memory device 100 shown in FIG. 3A, FIG. 4A and FIG. 4B is formed by the method 400C, and an area overhead of the memory device 100 can be significantly reduced.

Figure 5:
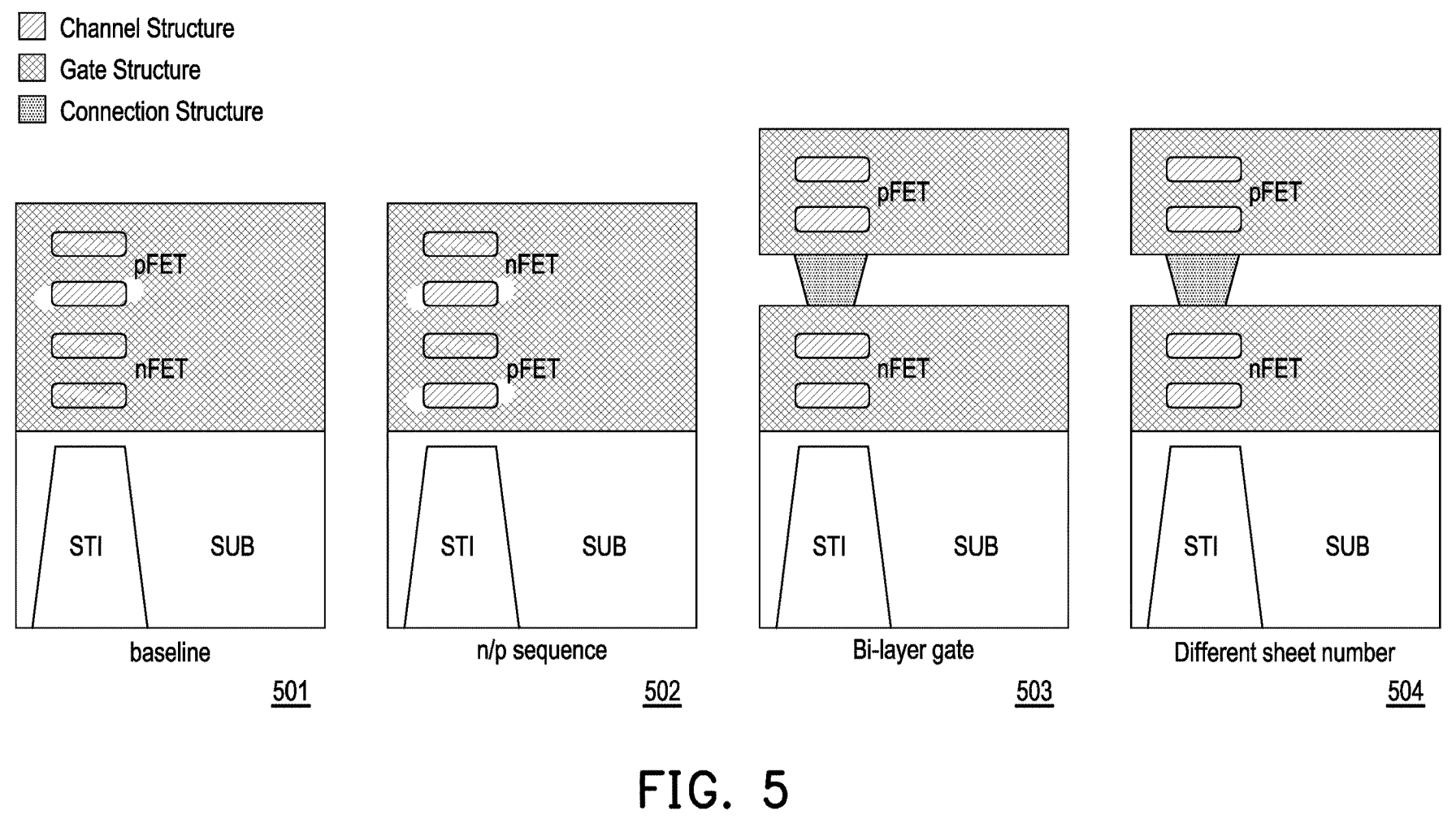

FIG. 5 is a schematic block diagram of variations of a complementary filed effect transistor in accordance with some embodiments of the present disclosure. With reference to FIG. 1 to FIG. 5, FIG. 5 depicts some variations of a complementary filed effect transistor which may be used as the transistors of the memory device 100. A CFET may be formed of two stacked GAA transistors and a CFET layout typically has P-type FETs (pFET) on one-level and N-type FETs (nFET) on an adjacent level (i.e., above or below). Between the pFET and the nFET, an etching stop layer ESL may be disposed or not. The CFET may be disposed on a substrate SUB with an isolation structure STI, but this disclosure is not limited thereto.

As shown in FIG. 5, a cross-section 501 depicts a baseline type of a CFET in which the pFET is directly disposed above the nFET and a cross-section 502 depicts a n/p sequence type of a CFET in which the nFET is directly disposed above the pFET. In the cross-section 501 and the cross-section 502, each of the semiconductor sheets/wires of the channel structures of these CFETs is wrapped by the corresponding gate structure. That is, each of the gate structure of these CFETs is shared by the semiconductor sheets/wires of the channel structures and thus these CETs are both single-layer gate CFETs.

Further, a cross-section 503 depicts a bi-layer gate type of a CFET in which the pFET is disposed above the nFET and an etching stop layer ESL is disposed between the pFET and the nFET. A cross-section 504 depicts a bi-layer gate type of a CFET in which the pFET is disposed above the nFET, an etching stop layer ESL is disposed between the pFET and the nFET, and a sheet number of the pFET is different from a sheet number of the nFET. That is, each of the semiconductor sheets/wires of the channel structures of pFET and nFET is wrapped by the corresponding gate structure. That is, each of these CEFs includes two gate structures and thus these CEFs are both bi-layer structures. In addition, this disclosure does not limit the sheet number of the nFET and the pFET of the CFET.

Figure 6:
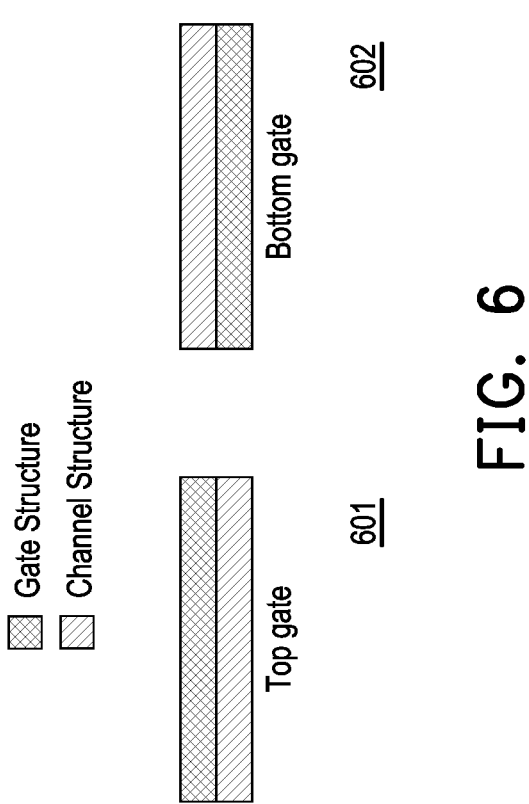
FIG. 6 is a schematic block diagram of variations of a planar back-end-of-line transistor in accordance with some embodiments of the present disclosure.

FIG. 6 is a schematic block diagram of variations of a planar back-end-of-line transistor in accordance with some embodiments of the present disclosure. With reference to FIG. 1 to FIG. 6, FIG. 6 depicts some variations of a planar back-end-of-line (BEOL) transistors may be used as the transistors of the memory device 100. A planar BEOL transistor includes a gate structure and a channel structure and a pair of source/drain regions are formed on opposite sides of the channel structure.

As shown in FIG. 6, a cross-section 601 depicts a top gate BEOL transistor that a gate structure of the BEOL transistor is disposed above a channel structure of the BEOL transistor and a cross-section 602 depicts a bottom gate BEOL transistor that a gate structure of the BEOL transistor is disposed below a channel structure of the BEOL transistor.

It is noted that, the variations of the CFETs and the variation of the BEOL transistors may be replaced, recombined, and mixed without departing from the spirit of the disclosure to complete or derive other embodiment. As long as the features of each embodiment do not violate the spirit of the disclosure or conflict with each other, they may be mixed and used together arbitrarily.

Based on the above, by utilizing three-dimensional structures instead of two-dimensional (planar) structures, a density of a memory device is increased and an area overhead of the memory device is reduced without a complicated layout of the memory device. Further, good write margin of the write operation and good static noise margin of the read operation may be provided by arranging different driving capabilities for different transistors.

In one embodiment, a memory device includes: write pass-gate transistor, disposed in a first layer; a read pass-gate transistor, disposed in a second layer above the first layer; a write word line, disposed in a metallization layer above the first layer and electrically coupled to the write pass-gate transistor through a write path; and a read word line, disposed in the metallization layer and electrically coupled to the read pass-gate transistor through a read path, wherein the write path is different from the read path.

In a related embodiment, the memory further includes: an inverter, including a pull-up transistor and a pull-down transistor; a bit line, disposed in the metallization layer, wherein in response of writing data into the memory device, the inverter is electrically coupled to the bit line through the write pass-gate transistor, and in response of reading data from the memory device, the inverter is electrically coupled to the bit line through the read pass-gate transistor.

In a related embodiment, wherein a gate structure of the pull-down transistor is different from a gate structure of the pull-down transistor.

In a related embodiment, wherein a gate structure is shared by the pull-up transistor and the pull-down transistor.

In a related embodiment, the memory further includes: an additional write pass-gate transistor, disposed in the first layer and electrically coupled to the write word line through an additional write path; an additional read pass-gate transistor, disposed in the second layer and electrically coupled to the read word line through an additional read path; wherein the additional write path is different from the additional read path.

In a related embodiment, wherein a driving capability of the write pass-gate transistor is higher than a driving capability of the read pass-gate transistor.

In a related embodiment, wherein a static noise margin of the read pass-gate transistor is higher than a static noise margin of the write pass-gate transistor.

In a related embodiment, wherein the write pass-gate transistor and the read pass-gate transistor are configured to form a complementary field effect transistor, and a sheet number of the write pass-gate transistor is greater than a sheet number of the read pass-gate transistor.

In a related embodiment, wherein the write pass-gate transistor is a front-end-of-line transistor, and the read pass-gate transistor is a back-end-of-line transistor.

In a related embodiment, wherein the read pass-gate transistor is a top gate transistor, and the metallization layer is disposed above the first layer and the second layer.

In a related embodiment, wherein the read pass-gate transistor is a bottom gate transistor, and the metallization layer is disposed between the first layer and the second layer.

In a related embodiment, wherein the read pass-gate transistor is a bottom gate transistor, and the bottom gate transistor is formed after the metallization layer is formed.

In another embodiment, a memory includes: two write pass-gate transistors, disposed in a first layer; two read pass-gate transistors, disposed above the first layer; two pull-down transistors, disposed in the first layer; two pull-up transistors, disposed in a second layer above the first layer; a write word line, disposed in a metallization layer above the second layer and electrically coupled to the two write pass-gate transistors through a write path and an additional write path respectively; and a read word line, disposed in the metallization layer and electrically coupled to the two read pass-gate transistors through a read path and an additional write path respectively, wherein the write path is different from the read path and the additional write path is different from the additional read path.

In a related embodiment, the memory further includes: two bit lines, disposed in the metallization layer, wherein in response of writing data into the memory device, the two pull-down transistors and the two pull-up transistors are electrically coupled to the two bit lines through the two write pass-gate transistors respectively, and in response of reading data from the memory device, the two pull-down transistors and the two pull-up transistors are electrically coupled to the two bit lines through the two read pass-gate transistors.

In a related embodiment, wherein driving capabilities of the two write pass-gate transistor are higher than driving capabilities of the two read pass-gate transistor.

In a related embodiment, wherein the two write pass-gate transistors are front-end-of-line transistors, and the two read pass-gate transistors are back-end-of-line transistors.

In yet another embodiment, a method for forming a memory device includes: forming two pull-down transistors and two write pass-gate transistors in a first layer; forming two pull-up transistors in a second layer above the first layer to form two complementary field effect transistors as two cross-coupled inverters formed of the two pull-down transistors and the two pull-up transistors; forming two read pass-gate transistors above the first layer; and forming a write word line, a read word line, and two bit lines in a metallization layer above the second layer.

In a related embodiment, wherein the two read pass-gate transistors are formed in the second layer to form two complementary field effect transistors formed of the two pull-down transistors and the two pull-up transistors.

In a related embodiment, wherein the two read pass-gate transistors are formed in a third layer between the second layer and the metallization layer, and the two read pass-gate transistor are back-end-of-line transistors.

In a related embodiment, wherein the two read pass-gate transistors are formed in a third layer above the metallization layer, and the two read pass-gate transistor are back-end-of-line transistors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a write pass-gate transistor, disposed in a first layer;
a read pass-gate transistor, disposed in a second layer above the first layer;
a write word line, disposed in a metallization layer above the first layer and electrically coupled to the write pass-gate transistor through a write path; and
a read word line, disposed in the metallization layer and electrically coupled to the read pass-gate transistor through a read path,
wherein the write path is different from the read path.

2. The memory device according to claim 1, further comprising:
an inverter, comprising a pull-up transistor and a pull-down transistor;
a bit line, disposed in the metallization layer,
wherein in response of writing data into the memory device, the inverter is electrically coupled to the bit line through the write pass-gate transistor, and
in response of reading data from the memory device, the inverter is electrically coupled to the bit line through the read pass-gate transistor.

3. The memory device according to claim 2, wherein a gate structure of the pull-up transistor is different from a gate structure of the pull-down transistor.

4. The memory device according to claim 2, wherein a gate structure is shared by the pull-up transistor and the pull-down transistor.

5. The memory device according to claim 2, further comprising:
an additional write pass-gate transistor, disposed in the first layer and electrically coupled to the write word line through an additional write path;
an additional read pass-gate transistor, disposed in the second layer and electrically coupled to the read word line through an additional read path;
wherein the additional write path is different from the additional read path.

6. The memory device according to claim 1, wherein a driving capability of the write pass-gate transistor is higher than a driving capability of the read pass-gate transistor.

7. The memory device according to claim 1, wherein a static noise margin of the read pass-gate transistor is higher than a static noise margin of the write pass-gate transistor.

8. The memory device according to claim 1, wherein the write pass-gate transistor and the read pass-gate transistor are configured to form a complementary field effect transistor, and
a sheet number of the write pass-gate transistor is greater than a sheet number of the read pass-gate transistor.

9. The memory device according to claim 1, wherein the write pass-gate transistor is a front-end-of-line transistor, and
the read pass-gate transistor is a back-end-of-line transistor.

10. The memory device according to claim 9, wherein the read pass-gate transistor is a top gate transistor, and
the metallization layer is disposed above the first layer and the second layer.

11. The memory device according to claim 9, wherein the read pass-gate transistor is a bottom gate transistor, and
the metallization layer is disposed between the first layer and the second layer.

12. The memory device according to claim 1, wherein the read pass-gate transistor is a bottom gate transistor, and
the bottom gate transistor is formed after the metallization layer is formed.

13. A memory device, comprising:
two write pass-gate transistors, disposed in a first layer;
two read pass-gate transistors, disposed above the first layer;
two pull-down transistors, disposed in the first layer;
two pull-up transistors, disposed in a second layer above the first layer;
a write word line, disposed in a metallization layer above the second layer and electrically coupled to the two write pass-gate transistors through a write path and an additional write path respectively; and
a read word line, disposed in the metallization layer and electrically coupled to the two read pass-gate transistors through a read path and an additional read path respectively,
wherein the write path is different from the read path and the additional write path is different from the additional read path.

14. The memory device according to claim 13, further comprising:
two bit lines, disposed in the metallization layer,
wherein in response of writing data into the memory device, the two pull-down transistors and the two pull-up transistors are electrically coupled to the two bit lines through the two write pass-gate transistors respectively, and
in response of reading data from the memory device, the two pull-down transistors and the two pull-up transistors are electrically coupled to the two bit lines through the two read pass-gate transistors.

15. The memory device according to claim 13, wherein driving capabilities of the two write pass-gate transistors are higher than driving capabilities of the two read pass-gate transistors.

16. The memory device according to claim 13, wherein the two write pass-gate transistors are front-end-of-line transistors, and
the two read pass-gate transistors are back-end-of-line transistors.

17. A method for forming a memory device, comprising:

forming two pull-down transistors and two write pass-gate transistors in a first layer;

forming two pull-up transistors in a second layer above the first layer to form two complementary field effect transistors as two cross-coupled inverters formed of the two pull-down transistors and the two pull-up transistors;

forming two read pass-gate transistors above the first layer; and forming a write word line, a read word line, and two bit lines in a metallization layer above the second layer.

18. The method for forming the memory device according to claim 17, wherein the two read pass-gate transistors are formed in the second layer to form two complementary field effect transistors formed of the two read pass-gate transistors and the write pass-gate transistors.

19. The method for forming the memory device according to claim 17, wherein the two read pass-gate transistors are formed in a third layer between the second layer and the metallization layer, and the two read pass-gate transistor are back-end-of-line transistors.

20. The method for forming the memory device according to claim 17, wherein the two read pass-gate transistors are formed in a third layer above the metallization layer, and the two read pass-gate transistor are back-end-of-line transistors.

* * * * *